US012435964B2

(12) United States Patent
Fulford et al.

(10) Patent No.: US 12,435,964 B2
(45) Date of Patent: Oct. 7, 2025

(54) CONTACTLESS CAPACITIVE MEASUREMENT TOOL WITH IMPROVED THROUGHPUT AND ACCURACY

(71) Applicant: Tokyo Electron Limited, Tokyo (JP)

(72) Inventors: Daniel Fulford, Albany, NY (US); Mark I. Gardner, Austin, TX (US); Henry Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 160 days.

(21) Appl. No.: 18/511,086

(22) Filed: Nov. 16, 2023

(65) Prior Publication Data
US 2025/0164230 A1    May 22, 2025

(51) Int. Cl.
*G01B 7/28*    (2006.01)
*G01D 5/24*    (2006.01)
(Continued)

(52) U.S. Cl.
CPC .............. *G01B 7/28* (2013.01); *G01D 5/24* (2013.01); *G01R 27/2605* (2013.01); *H01L 21/67288* (2013.01)

(58) Field of Classification Search
CPC ........ G01R 27/00; G01R 27/02; G01R 27/26; G01D 5/00; G01D 5/12; G01D 5/14;
(Continued)

(56) References Cited

U.S. PATENT DOCUMENTS 5,436,790 A    7/1995  Blake et al.
6,377,060 B1 *  4/2002  Burkhart ........... H01L 21/67259
                                                324/662
(Continued)

FOREIGN PATENT DOCUMENTS

IL        162102 A  *  9/2009  ........... G01B 11/306
JP     2010021270 A  *  1/2010  ............. H01L 21/66
(Continued)

OTHER PUBLICATIONS

Capas, "Developement of an Off-Line Silicon Wafer Warpage Measuring Tool", Master of Science Thesis Trita-ITM-EX 2021:8, Jan. 18, 2021, 74 pgs.
(Continued)

*Primary Examiner* — Hoai-An D. Nguyen
(74) *Attorney, Agent, or Firm* — Egan, Enders & Huston LLP.

(57) ABSTRACT

Systems and methods are provided herein for determining the planarity of a semiconductor wafer. The systems and methods described herein utilize a capacitive measurement tool to detect and characterize the bow of a semiconductor wafer. The capacitive measurement tool disclosed herein utilizes a non-contact, capacitive sensor unit to measure wafer bow. Unlike conventional capacitive sensing techniques used to measure wafer bow, the capacitive sensor unit disclosed herein uses a plurality of electrodes for simultaneously obtaining a plurality of capacitance measurements from the wafer at various locations on the wafer surface. By including a plurality of electrodes within the capacitive sensor unit, the techniques described herein increase the amount of data collected across the wafer surface at any given time to improve the throughput and measurement accuracy of the capacitive measurement tool.

23 Claims, 12 Drawing Sheets

(51) Int. Cl.
*G01R 27/26* (2006.01)
*H01L 21/67* (2006.01)

(58) Field of Classification Search
CPC .. G01B 7/00; G01B 7/28; H01L 21/00; H01L 21/67; H01L 21/67005; H01L 21/67242; H01L 21/67259; H01L 21/67288
USPC ................................ 324/600, 649, 658, 686
See application file for complete search history.

(56) References Cited

U.S. PATENT DOCUMENTS

| | | | | |
|---|---|---|---|---|
| 6,678,055 | B2 * | 1/2004 | Du-Nour | G01B 11/306 356/504 |
| 9,978,582 | B2 | 5/2018 | Batinica et al. | |
| 10,811,265 | B2 | 10/2020 | DeVilliers | |
| 2003/0098704 | A1 * | 5/2003 | Du-Nour | G01B 11/16 324/762.05 |
| 2021/0366792 | A1 | 11/2021 | Fulford et al. | |
| 2022/0074869 | A1 | 3/2022 | Arora et al. | |

FOREIGN PATENT DOCUMENTS

| | | | | | |
|---|---|---|---|---|---|
| JP | 2012216752 | A | * | 11/2012 | ....... H01L 21/67201 |
| JP | 2018141720 | A | * | 9/2018 | ............... G01L 1/22 |
| KR | 2012112165 | A | * | 10/2012 | ....... H01L 21/67098 |
| TW | 202301086 | A | * | 1/2023 | ............. G06F 3/041 |

OTHER PUBLICATIONS

KLA Corporation, "PWG5, Wafer Geometry and Nanotopography Metrology System", Rev. 1, Nov. 17, 2020, 4 pgs.
Vitrek, "Measure Wafer Bow, Warp and TTV With Capacitance", Oct. 25, 2023, 2 pgs.
Trujillo-Sevilla et al., "New Wafer Shape Measurement Technique for 300mm Blank Vertically Held Silicon Wafer", SPIE Digital Library, Mar. 8, 2023, 4 pgs.
Vitrek, "About Wafer Bow and Warp Measurement Systems", Oct. 25, 2023, 4 pgs.
Fulford et al., "Device and Method for Determining Wafer Bow", U.S. Appl. No. 18/485,762, filed Oct. 12, 2023, 25 pgs.

* cited by examiner

CONTACTLESS CAPACITIVE MEASUREMENT TOOL WITH IMPROVED THROUGHPUT AND ACCURACY

RELATED APPLICATION

The present disclosure is related to U.S. application Ser. No. 18/485,762, which is entitled "Device and Method for Determining Wafer Bow," filed Oct. 12, 2023 and incorporated by reference in its entirety.

BACKGROUND

The present disclosure relates to the semiconductor fabrication, and more particularly, to systems, metrology tools and methods for measuring wafer bow.

Semiconductor fabrication generally begins with a flat semiconductor wafer (W), such as that illustrated in FIG. 1(a). During fabrication of the semiconductor wafer, multiple processing steps are executed to form structures on material layers formed on the semiconductor substrate. These processing steps can include depositing material on the substrate, exposing the substrate to actinic radiation, removing material from the substrate, implanting dopants, annealing, baking, and so forth. The different materials and structural formations can cause internal stresses in the substrate which may result in bowing of the wafer, warping of the wafer or difference in wafer thickness.

FIG. 1(b) illustrates a first order bowing of a semiconductor wafer (W). Wafer bow is defined as the deviation of the center point of the median surface (i.e., the locus of points in the wafer equidistant between the front and back surfaces) of a free, unclamped wafer W from a reference plane. As shown in FIG. 1(b), the bow measurement (d) is a z-height deviation between the median surface of the wafer W and the reference plane. The bow measurement can be a positive value when compressive forces cause a positive wafer bow, or a negative value when tensile forces cause a negative wafer bow.

FIG. 1(c) illustrates a second order bowing or warping of a semiconductor wafer (W). Warping is defined as the differences between the maximum distance ($d_{max}$) and minimum distance ($d_{min}$) of the median surface of a free, unclamped wafer W from a reference plane. As shown in FIG. 1(c), the measurements $d_{max}$ and $d_{min}$ identify positive and negative z-height deviations, respectively, between the median surface of the wafer W and the reference plane. By looking at the entire wafer, the warp provides a more useful measurement of true wafer shape.

The planarity of wafers used to manufacture integrated circuits (ICs) is controlled to tight tolerances to ensure that the wafers are sufficiently flat for lithographic processing. Variations in wafer planarity must be smaller than the depth of focus of optical lithography exposure tools over the illuminated region of the top surface of the wafer. To ensure a wafer remains in the depth of focus of the lithography process being used, it is necessary to measure the wafer planarity to ensure the upper surface of the wafer is substantially flat and within the specification of the optical lithography system being used, since bowing or warping of the wafer could result in defective IC patterns which raise costs through scrap and wasted time.

Conventional methods for measuring the wafer planarity include laser interferometry and capacitive sensing. Laser interferometry is a measurement technique that directs laser light to the wafer and measures the changes in the wavelength of light reflected from the wafer surface. In laser interferometry, a beam splitter is used to split a laser beam into two separate beams. One beam is directed to the wafer, while the other beam is directed to a reference mirror. Both beams are reflected back to the beam splitter, where they recombine to create an interference pattern, which is detected by a photodetector. By analyzing the interference pattern detected by the photodetector, laser interferometry can measure the degree of bowing or warping in the wafer. For example, if the wafer is warped, the reflected light waves will have traveled slightly different distances, resulting in a shift in the interference pattern. While laser interferometry is useful for detecting defects in the wafer, or ensuring the wafer meets certain specifications for use in electronic devices, laser interferometry is expensive and time consuming.

Capacitive sensing techniques have also been used to measure the flatness of a semiconductor wafer. While capacitive-based bow measurement tools cost less than laser interferometry, these tools can only obtain capacitive measurements from the wafer one location at a time, and must be manually or automatically scanned across the wafer surface to obtain capacitive measurements from more than one location on the wafer surface. This increases measurement time and decreases throughput.

SUMMARY

The present disclosure provides various embodiments of improved systems and methods for determining the planarity of a semiconductor wafer. More specifically, the present disclosure provides various embodiments of improved systems and methods that utilize a capacitive measurement tool to measure and characterize the bow of a semiconductor wafer. The capacitive measurement tool disclosed herein utilizes a non-contact, capacitive sensor unit to measure wafer bow. Unlike conventional capacitive sensing techniques used to measure wafer bow, the capacitive sensor unit disclosed herein uses a plurality of electrodes for simultaneously obtaining a plurality of capacitance measurements from the wafer at various locations on the wafer surface. By including a plurality of electrodes within the capacitive sensor unit, the techniques described herein increase the amount of data collected across the wafer surface at any given time to improve the throughput and measurement accuracy of the capacitive measurement tool.

The capacitive sensor unit described herein may configured in a variety of different ways. In some embodiments, the capacitive sensor unit may be disc-shaped and configured to obtain multiple capacitance values across the wafer surface, while the capacitive sensor unit is held stationary a fixed distance away from the wafer surface. In other embodiments, the capacitive sensor unit may be bar-shaped and configured to obtain multiple capacitance values across the wafer surface, while the capacitive sensor unit is held a fixed distance away and either scanned or rotated across the wafer surface. In either embodiment, the capacitive sensor unit may obtain capacitive measurements from the wafer surface while the wafer is supported on a horizontal or vertical wafer mount.

According to one embodiment, a system comprising a wafer mount, a capacitive sensor unit and a controller is provided herein. The wafer mount may be configured for supporting a semiconductor wafer in a horizontal or vertical orientation. The capacitive sensor unit may include a sensor housing having a first surface and a plurality of electrodes, which are provided on the first surface of the sensor housing and laterally spaced from one another. The first surface of the sensor housing is a surface that faces a surface of the semiconductor wafer when the capacitive sensor unit is in close proximity to the semiconductor wafer.

When the capacitive sensor unit is positioned in close proximity to the semiconductor wafer, each electrode works in conjunction with a corresponding opposing area on the surface of the semiconductor wafer to form a capacitor with: (a) the electrode forming a top plate of the capacitor, (b) the corresponding opposing area on the surface of the semiconductor wafer forming a bottom plate of the capacitor, and (c) an air gap between the electrode and the semiconductor wafer serving as the capacitor dielectric medium. The controller is configured to: (a) obtain a plurality of capacitance values from the plurality of electrodes by measuring a capacitance between each electrode and the corresponding opposing area on the surface of the semiconductor wafer, (b) calculate a distance between each electrode and the corresponding opposing area of the surface of the semiconductor wafer based on the capacitance value measured at the electrode, and (c) determine a bow of the semiconductor wafer based on the calculated distances.

In some embodiments, the capacitive sensor unit may be a disc-shaped capacitive sensor unit, and the first surface of the sensor housing may have a circular surface area substantially equal to a circular surface area of the semiconductor wafer. In such embodiments, the plurality of electrodes may comprise 10 to 1000 electrodes, which are laterally spaced across the first surface of the sensor housing of the disc-shaped capacitive sensor unit in a two-dimensional (2D) electrode array. The controller may use the 2D electrode array to simultaneously obtain the plurality of capacitance values from the plurality of electrodes, while the semiconductor wafer is held stationary by the wafer mount and the disc-shaped capacitive sensor unit is held stationary a fixed distance away from the surface of the semiconductor wafer.

In some embodiments, the capacitive sensor unit may be a bar-shaped capacitive sensor unit, wherein the length of the sensor housing is substantially equal to a diameter of the semiconductor wafer. In such embodiments, the plurality of electrodes may comprise 10 to 100 electrodes, which are laterally spaced across the first surface of the sensor housing of the bar-shaped capacitive sensor unit in a linear electrode array. The controller may use the linear electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is scanned in a linear direction across the surface of the semiconductor wafer, while the semiconductor wafer is held stationary by the wafer mount, or (b) the bar-shaped capacitive sensor unit is held stationary, while the semiconductor wafer is scanned in a linear direction by the wafer mount.

In some embodiments, the capacitive sensor unit may be a bar-shaped capacitive sensor unit, wherein the length of the sensor housing is substantially equal to a radius of the semiconductor wafer. In such embodiments, the plurality of electrodes may comprise 10 to 50 electrodes, which are laterally spaced across the first surface of the sensor housing of the bar-shaped capacitive sensor unit in a radial electrode array. The controller may use the radial electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is rotated across the surface of the semiconductor wafer, while the semiconductor wafer is held stationary by the wafer mount, or (b) the semiconductor wafer is rotated by the wafer mount, while the bar-shaped capacitive sensor unit is held stationary.

In some embodiments, the semiconductor wafer and the capacitive sensor unit may be supported in a horizontal orientation while the plurality of capacitance values are obtained. In other embodiments, the semiconductor wafer and capacitive sensor unit may be supported in a vertical orientation while the plurality of capacitance values are obtained.

In some embodiments, the system may be a wafer processing system, and the wafer mount and the capacitive sensor unit may be included within a metrology tool, which is provided within the wafer processing system for measuring a wafer bow of at least one semiconductor wafer processed by the wafer processing system.

According to another embodiment, a metrology tool is provided herein for measuring wafer bow. The metrology tool may generally include a wafer mount, a bar-shaped capacitive sensor unit, a movement device and a controller. The wafer mount may be configured for supporting a semiconductor wafer in a horizontal or vertical orientation. The bar-shaped capacitive sensor unit may include a sensor housing having a first surface and a plurality of electrodes, which are provided on the first surface of the sensor housing and arranged in a line along a length of the sensor housing. The first surface of the sensor housing is a surface that faces a surface of the semiconductor wafer when the bar-shaped capacitive sensor unit is in close proximity to the semiconductor wafer.

When the capacitive sensor unit is positioned in close proximity to the semiconductor wafer, each electrode works in conjunction with a corresponding opposing area on the surface of the semiconductor wafer to form a capacitor with: (a) the electrode forming a top plate of the capacitor, (b) the corresponding opposing area on the surface of the semiconductor wafer forming a bottom plate of the capacitor, and (c) an air gap between the electrode and the semiconductor wafer serving as the capacitor dielectric medium. The movement device is configured to move at least one of the wafer mount and the bar-shaped capacitive sensor unit relative to each other. The controller is configured to: (a) obtain a plurality of capacitance values from the plurality of electrodes by measuring a capacitance between each electrode and the corresponding opposing area on the surface of the semiconductor wafer, (b) calculate a distance between each electrode and the corresponding opposing area of the surface of the semiconductor wafer based on the capacitance value measured at the electrode, and (c) determine a bow of the semiconductor wafer based on the calculated distances.

In some embodiments, a length of the sensor housing may be substantially equal to a diameter of the semiconductor wafer. In such embodiments, the plurality of electrodes may comprise 10 to 100 electrodes, which are laterally spaced across the first surface of the sensor housing of the bar-shaped capacitive sensor unit in a linear electrode array. The controller may use the linear electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is scanned in a linear direction across the surface of the semiconductor wafer by the movement device, while the semiconductor wafer is held stationary by the wafer mount, or (b) the bar-shaped capacitive sensor unit is held stationary, while the semiconductor wafer supported by the wafer mount is scanned in a linear direction by the movement device.

In some embodiments, a length of the sensor housing may be substantially equal to a radius of the semiconductor wafer. In such embodiments, the plurality of electrodes may comprise 10 to 50 electrodes, which are laterally spaced across the first surface of the sensor housing of the bar-shaped capacitive sensor unit in a radial electrode array. The controller may use the radial electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is rotated across the surface of the semiconductor wafer by the movement device, while the semiconductor wafer is held stationary by the wafer mount, or (b) the semiconductor wafer supported by the wafer mount is rotated by the movement device, while the bar-shaped capacitive sensor unit is held stationary.

In some embodiments, the semiconductor wafer and the bar-shaped capacitive sensor unit may be supported in a horizontal orientation while the plurality of capacitance values are obtained. In some embodiments, the semiconductor wafer and the bar-shaped capacitive sensor unit may be supported in a vertical orientation while the plurality of capacitance values are obtained.

According to yet another embodiment, a method is provided herein for measuring wafer bow. The method may generally include: (a) positioning a capacitive sensor unit in close proximity to a semiconductor wafer, the capacitive sensor unit comprising a sensor housing and a plurality of electrodes, each electrode facing a corresponding opposing area on a surface of the semiconductor wafer, such that the electrode and the corresponding opposing area form a capacitor; (b) moving the capacitive sensor unit across the surface of the semiconductor wafer; (c) obtaining a plurality of capacitance values from the plurality of electrodes by measuring a capacitance between each electrode and the corresponding opposing area on the surface of the semiconductor wafer as the capacitive sensor unit moves across the surface of the semiconductor wafer; (d) calculating a distance between each electrode and the corresponding opposing area of the surface of the semiconductor wafer based on the capacitance value measured at the electrode; and (e) determining a bow of the semiconductor wafer based on the calculated distances.

In some embodiments, the method may obtain the plurality of capacitance values by measuring the capacitance between each electrode and the corresponding opposing area on the surface of the semiconductor wafer while scanning the capacitive sensor unit in a linear direction across the surface of the semiconductor wafer.

In other embodiments, the method may obtain the plurality of capacitance values by measuring the capacitance between each electrode and the corresponding opposing area on the surface of the semiconductor wafer while rotating the capacitive sensor unit in a radial direction across the surface of the semiconductor wafer.

Various embodiments of systems, metrology tools and methods are provided herein for measuring wafer bow using a non-contact, capacitive measurement tool. Of course, the order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed inventions. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
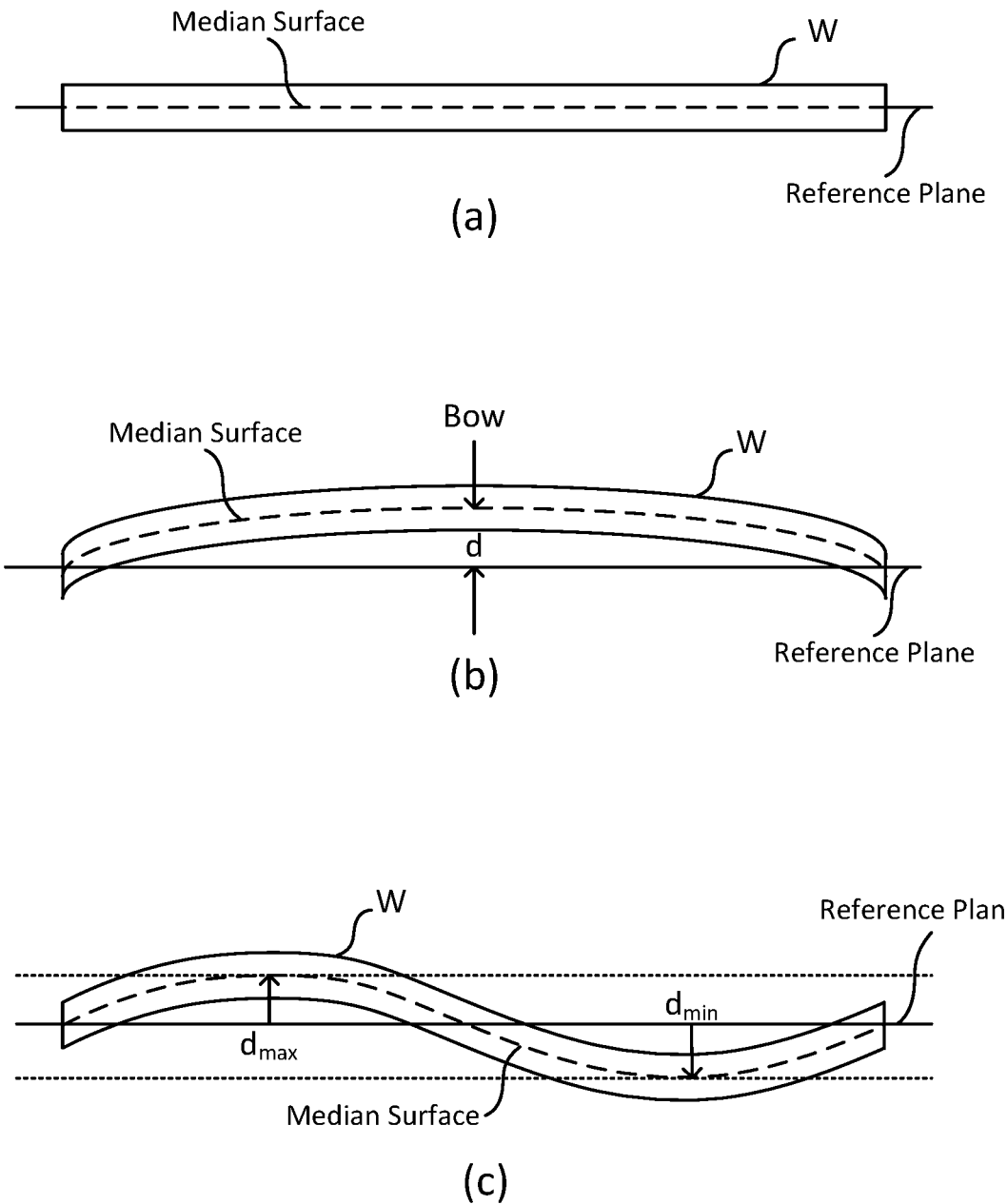
FIG. 1 (Prior Art) is a schematic diagram illustrating: (*a*) a flat semiconductor wafer, (*b*) bowing of a semiconductor wafer and (*c*) warping of a semiconductor wafer.

The present disclosure provides various embodiments of improved systems and methods for determining the planarity of a semiconductor wafer. More specifically, the present disclosure provides various embodiments of improved systems and methods that utilize a capacitive measurement tool to measure and characterize the bow of a semiconductor wafer. The capacitive measurement tool disclosed herein utilizes a non-contact, capacitive sensor unit to measure wafer bow. Unlike conventional capacitive sensing techniques used to measure wafer bow, the capacitive sensor unit disclosed herein uses a plurality of electrodes for simultaneously obtaining a plurality of capacitance measurements from the wafer at various locations on the wafer surface. By including a plurality of electrodes within the capacitive sensor unit, the techniques described herein increase the amount of data collected across the wafer surface at any given time to improve the throughput and measurement accuracy of the capacitive measurement tool.

The capacitive sensor unit described herein may configured in a variety of different ways. In some embodiments, the capacitive sensor unit may be disc-shaped and configured to obtain multiple capacitance values across the wafer surface, while the capacitive sensor unit is held stationary a fixed distance away from the wafer surface. In other embodiments, the capacitive sensor unit may be bar-shaped and configured to obtain multiple capacitance values across the wafer surface, while the capacitive sensor unit is held a fixed distance away and either scanned or rotated across the wafer surface. In either embodiment, the capacitive sensor unit may obtain capacitive measurements from the wafer surface while the wafer is supported on a horizontal or vertical wafer mount.

The techniques described herein determine wafer bow from capacitance measurements obtained at different locations across the wafer. In the disclosed embodiments, a capacitor structure is formed between each electrode included within the capacitive sensor unit and an opposing area of the wafer surface with air between the electrode and wafer surface serving as the capacitor dielectric medium. This non-contact, capacitive sensing method enables calculation of variable z-height distances (i.e. spacing between the electrodes and the wafer) across the wafer surface to determine the wafer bow caused by a given process step. Thus, the bow can be calibrated to capacitance both prior and after each wafer processing step, and output can be utilized for wafer processing tools to obtain a more precise wafer surface map, which can be used to enhance wafer patterning. The techniques described herein greatly enhance the ability to obtain precise wafer bow measurements at each step of the wafer fabrication flow. In some embodiments, a plurality of capacitive values can be measured simultaneously across at least a portion of the wafer to detect stress regions accurately and efficiently and with very good throughput for optimum measurement tool performance.

Figure 2A:
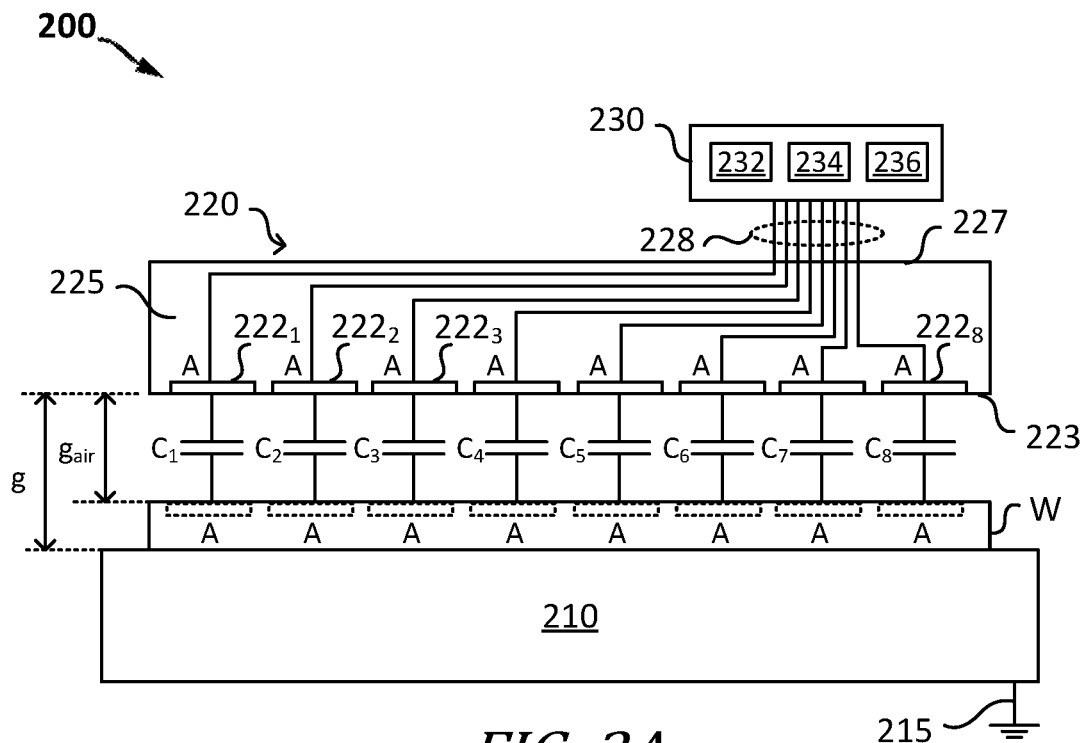
FIG. 2A is a schematic diagram illustrating a capacitive measurement tool for measuring wafer bow in accordance with one embodiment of the present disclosure, the capacitive measurement tool comprising a capacitive sensor unit including a sensor housing, a plurality of electrodes formed on/within a surface of the sensor housing and a controller communicatively coupled to the electrodes.
Figure 2B:
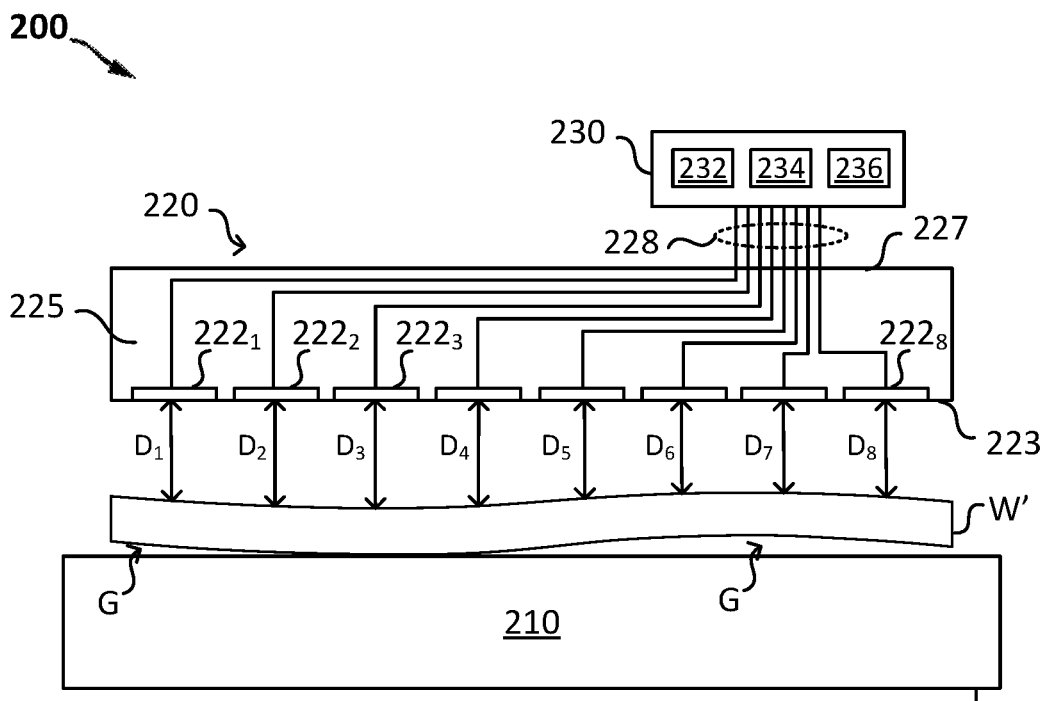
FIG. 2B is a schematic diagram illustrating the capacitive measurement tool shown in FIG. 2A when the capacitive sensor unit is arranged near a bowed wafer.

FIGS. 2A-2B illustrate an improved capacitive measurement tool for determining wafer bow according to one embodiment of the present disclosure. As shown in FIGS. 2A-2B, the capacitive measurement tool 200 includes a wafer mount 210 for supporting a semiconductor wafer (W), a capacitive sensor unit 220 for obtaining multiple capacitance values (e.g., $C_1 \ldots C_8$) across the wafer surface and a controller 230 for determining the planarity of a wafer W, and measuring the wafer bow if the wafer W is determined to be non-planar.

In the embodiment shown in FIGS. 2A-2B, the wafer mount 210 is configured to support the wafer W in a horizontal orientation. For example, the wafer mount 210 may have a substantially circular support surface for supporting the wafer W mounted thereon in a horizontal orientation. Other support structures may also be used to support the wafer W in a horizontal or vertical orientation. In some embodiments, a vertical wafer mount may be used to support the wafer W in a vertical orientation as shown, for example, in FIGS. 9 and 10. Regardless of whether a horizontal or vertical wafer mount is used, a ground connection 215 is connected to the wafer mount 210 to provide an electrical ground potential.

The capacitive sensor unit 220 and the wafer mount 210 are preferably movable in relation to one another. Such relative movement may be rotational, horizontal and/or vertical. As would be appreciated by one skilled in the art, relative movement between the capacitive sensor unit 220 and the wafer mount 210 may be implemented by moving the wafer mount 210, the capacitive sensor unit 220, or both the wafer mount 210 and the capacitive sensor unit 220. Examples of how the wafer mount 210 and/or capacitive sensor unit 220 can be moved in relation to each other are shown in FIGS. 4-10 and described in more detail below.

The capacitive sensor unit 220 includes a sensor housing 225 having a first surface 223 facing the wafer mount 210 and a second surface 227, which is opposite to the first surface 223. The sensor housing 225 supports a plurality of electrodes 222 laterally spaced from one another, each comprising a conductive plate having a surface area (A) and facing a respective opposing area (A) of the wafer surface. The plurality of electrodes 222 are formed on (or partially embedded within) the first surface 223 of the sensor housing 225, and are laterally spaced across the first surface 223 in the x and/or y direction. Although eight electrodes ($222_1 \ldots 222_8$) are shown in FIGS. 2A-2B for explanatory purposes, the sensor housing 225 preferably includes a greater number of electrodes (e.g., approximately 10-1000 electrodes).

The capacitive sensor unit 220 also includes a plurality of signal lines 228, which are coupled to the plurality of electrodes 222 and supported by the sensor housing 225. One end of each signal line 228 is connected to a respective electrode 222, while an opposite end of the signal line 228 is provided as an output from the capacitive sensor unit 220 and connected to the controller 230. More specifically, the plurality of signal lines 228 are routed from the respective electrodes 222, through the sensor housing 225 and out of the sensor housing 225 through the second surface 227, as shown in FIGS. 2A-2B. The sensor housing 225 may comprise any suitable dielectric material for electrically insulating the signal lines 228 from one another to prevent short circuiting and crosstalk between the signal lines 228.

During operation of the capacitive measurement tool 200, the capacitive sensor unit 220 is positioned in close proximity to the wafer W, such that a gap (g) exists between the first surface 223 of the sensor housing 225 and the wafer mount 210. When positioned in close proximity to the wafer W, as shown in FIGS. 2A-2B, each electrode 222 works in conjunction with a respective, opposing area (A) of the wafer W to form a capacitor with: (a) the electrode 222 forming a top plate of the capacitor, (b) the opposing area of the wafer W forming a bottom plate of the capacitor, and (c) the air gap ($g_{air}$) between the electrode 222 and the wafer W serving as the capacitor dielectric medium.

The controller 230 is connected to the signal lines 228 for supplying a voltage to, and receiving signals from, the plurality of electrodes 222 to measure the capacitance (C) between each electrode and corresponding opposing area (A) of the wafer W. The controller 230 may generally include a voltage source 232 for providing a voltage on each electrode 222, a capacitance measurement circuit 234 for measuring a capacitance (C) associated with each electrode 222 and a processing unit 236 for determining a distance (D) between each electrode 222 and respective opposing area (A) of the wafer surface based on the capacitance.

Voltage source 232 may provide AC and/or DC voltage of any suitable magnitude and frequency to the signal lines 228 for determining the capacitance (C) value at each respective electrode 222. The capacitance measurement circuit 234 may be any suitable circuit for determining the capacitance (C) value associated with each electrode 222. In some embodiments, the voltage source 232 may provide a DC voltage to each of the electrodes 222, and the capacitance measurement circuit 234 may determine the capacitance (C) value by a time constant of the DC current flow through the capacitor formed between the electrode and a respective, opposing wafer surface. Alternatively, the voltage source 232 may provide an AC voltage to each of the electrodes 222, and the capacitance measurement circuit 234 may determine the capacitance (C) value by a capacitive reactance of the capacitor formed between the electrode and a respective, opposing wafer surface.

The processing unit 236 includes a processor and a memory. The memory stores software which, when executed by the processor, causes the controller 230 to perform various functions related to detecting and characterizing wafer bow in accordance with the present disclosure. In one example embodiment, the processing unit 236 executes the software stored within the memory to calculate a distance (D) between each electrode 222 to a respective, opposing area of the wafer W based on a capacitance (C) value measured on each respective electrode 222. For example, the distance (D) may be determined from the formula C=kA/D, where 'C' is capacitance, 'A' is a cross sectional area of the electrode 222, 'D' is the distance between each electrode 222 and opposing area of the wafer W, and 'k' is a dielectric constant of the capacitor dielectric medium. In some embodiments, a dielectric constant (k) substantially equal to 1 may be used when the capacitor dielectric medium is air. Other dielectric constants may be utilized when other gases are present within the space between the capacitive sensor unit 220 and the wafer W. In some embodiments, the wafer mount 210 and capacitive sensor unit 220 may be housed within a chamber that can provide a vacuum environment or any suitable gas environment for providing an appropriate dielectric medium for each capacitor.

In the embodiment shown in FIG. 2A, a semiconductor wafer W having a substantially planar surface is provided on the wafer mount 210. When the capacitive sensor unit 220 is positioned in close proximity to a substantially planar wafer, the capacitance values (e.g., $C_1 \ldots C_8$) measured by the capacitance measurement circuit 234 are substantially equal, causing the processing unit 236 to calculate a substantially equal distance (D) between each of the electrodes $222_1 \ldots 222_8$ and a corresponding opposing area of the wafer W. When this occurs, the controller 230 determines that the wafer W is substantially planar (within some tolerance). Although a substantially planar wafer is shown in FIG. 2A, other wafers provided on the wafer mount 210 may have a substantially non-planar, or bowed surface.

FIG. 2B illustrates the capacitive measurement tool 200 shown in FIG. 2A when the capacitive sensor unit 220 is arranged near a bowed wafer (W'). As shown in FIG. 2B, the bowed wafer W' will present local gaps (G) under the wafer W' which result in a variable distance (D) between the upper surface of the wafer W' and the first surface 223 of the capacitive sensor unit 220. In the example shown in FIG. 2B, $D_1$ represents a distance from electrode $222_1$ to the wafer W', $D_2$ represents a distance from electrode $222_2$ to the wafer W', $D_3$ represents a distance from electrode $222_3$ to the wafer W', etc. Thus, and as shown in FIG. 2B, $D_1 \ldots D_8$ are different from one another due to the bowed state of wafer W'.

During operation of the capacitive measurement tool 200, the voltage source 232 provides a voltage on each electrode 222 which causes current flow to the grounded wafer W' directly opposite the electrode 222, and a capacitance measurement is obtained for each electrode by the capacitance measurement device 234. As the distances $D_1 \ldots D_8$ are different from each other, the capacitance values $C_1 \ldots C_8$ obtained from the electrodes $222_1 \ldots 222_8$ are also different from each other. The processing unit 236 uses the capacitance value obtained at each electrode 222 to calculate a precise distance value $D_1 \ldots D_8$ for each electrode, according to the formula discussed above, and uses the distance values $D_1 \ldots D_8$ to determine: (a) whether the wafer is planar or non-planar, and (b) characteristics of a bow in the wafer, if the wafer is determined to be non-planar.

In some embodiments, the processing unit 236 may execute software that provides a wafer bow mapping based on the distance values $D_1 \ldots D_8$ calculated for each electrode 222 to the opposing area of the wafer W'. In some embodiments, the wafer bow mapping may be a 3D model of the wafer bow, which can be used to control further processing of the wafer W'. In one example, the wafer bow data may be used to perform bow mitigation processes, such as film formation on one or more sides of the wafer W', as discussed further below.

The capacitive sensor unit 220 shown schematically in FIGS. 2A-2B may configured in a wide variety of different ways. FIGS. 3-6 illustrate example configurations of the capacitive sensor unit 220, according to various embodiments of the present disclosure. Other configurations that fall within the scope of the present disclosure, but not specifically shown and described herein, may also be utilized to characterize wafer bow.

Figure 3:
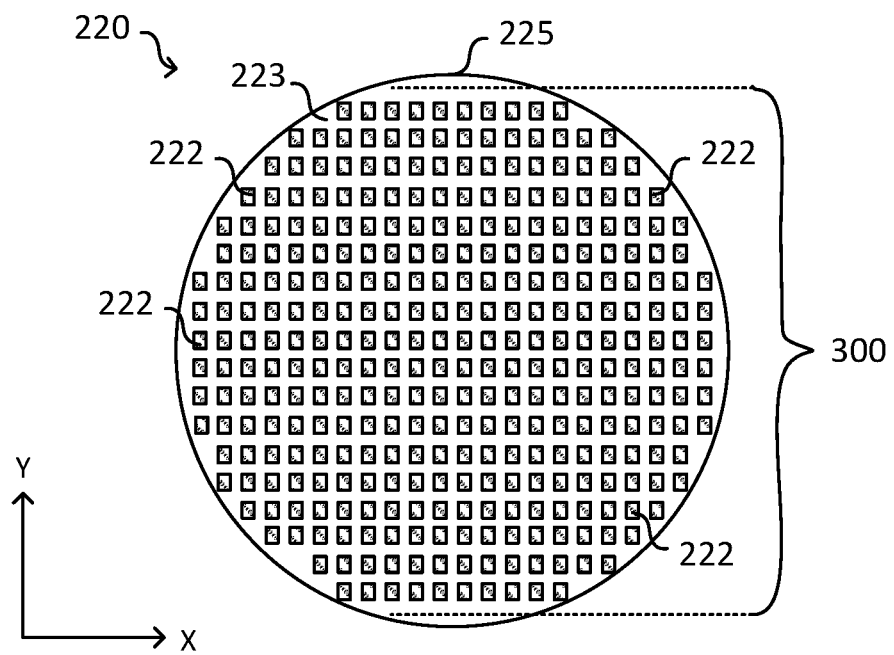
FIG. 3 is an underside view of a capacitive sensor unit configured in accordance with a first embodiment of the present disclosure.

FIG. 3 illustrates a first embodiment of the capacitive sensor unit 220 where the capacitive sensor unit 220 is disc-shaped and roughly the same size as the wafer W. As shown in FIG. 3, the first surface 223 of the sensor housing 225 has a circular surface area, which is substantially equal to a circular surface area of the wafer W. In this embodiment, the plurality of electrodes 222 formed on (or embedded within) the first surface 223 of the sensor housing 225 are laterally spaced across the first surface 223 of the sensor housing 225 in a two-dimensional (2D) electrode array 300.

The precise number and arrangement of the electrodes 222 included within the 2D electrode array 300 may be determined based on the resolution and throughput of a particular measurement application. In some embodiments, approximately 10-1000 electrodes may be used to provide a high-density electrode array pattern, which can be used to map the wafer surface and determine a global bow of the wafer. It is noted, however, that the 2D electrode array 300 shown in FIG. 3 is not limited to any particular number of electrodes and may alternatively include a smaller or larger number of electrodes than shown and described herein. For example, the 2D electrode array 300 may include 50-100 electrodes, 100-200 electrodes, 200-500 electrodes, 500-1000 electrodes, etc. In some embodiments, a larger number of electrodes (e.g., in the thousands or tens of thousands) may be used to provide a very high-density, 2D electrode array pattern.

During operation of the capacitive measurement tool 200, the controller 230 uses the electrodes 222 within the 2D electrode array 300 to obtain capacitance measurements from the wafer W, while the wafer W is held stationary by the wafer mount 210 and the capacitive sensor unit 220 shown in FIG. 3 is held stationary a fixed distance away from the wafer surface. In this embodiment, the controller 230 uses the electrodes 222 within the 2D electrode array 300 to provide a 2D mapping of the surface of the wafer W in the XY directions, while the capacitance values measured between the electrodes 222 and the wafer surface enable a distance to be determined in the Z direction at each electrode 222. Thus, the 2D electrode array 300 shown in FIG. 3 enables a 3D model of the wafer surface to be constructed from capacitance values obtained while the wafer W and the capacitive sensor unit 220 are both held stationary. In some embodiments, the controller 230 may utilize each of the electrodes 222 within the 2D electrode array 300 to construct a 3D model of the wafer surface and determine the wafer bow (if present). In other embodiments, the controller 230 may utilize a smaller subset of the electrodes 222 within the 2D electrode array 300 to reduce time for computing the distance and constructing a 3D model of wafer surface.

Figure 4:
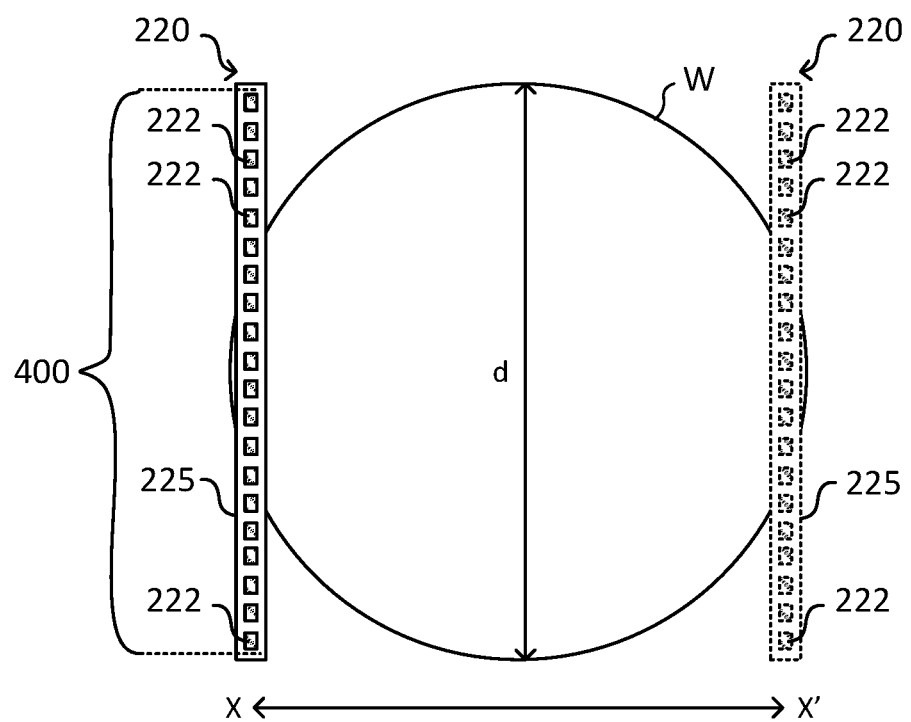
FIG. 4 is a top-down, cross-sectional view through a capacitive sensor unit configured in accordance with a second embodiment of the present disclosure.

FIG. 4 illustrates a second embodiment of the capacitive sensor unit 220 where the capacitive sensor unit 220 is linear, or bar-shaped. In the embodiment shown in FIG. 4, the length of the sensor housing 225 is roughly equivalent to the diameter (d) of the wafer W, and the electrodes 222 formed on (or embedded within) the first surface 223 of the sensor housing 225 are arranged in a line along the length of the sensor housing 225 to produce a linear electrode array 400.

Like the 2D electrode array 300 shown in FIG. 3, the number of electrodes 222 included within the linear electrode array 400 may be determined based on the resolution and throughput of a particular measurement application. In some embodiments, approximately 10-100 electrodes may be used to provide a high density electrode array pattern, which can be scanned across the wafer surface to map the wafer surface and determine the global bow of the wafer. However, a smaller or larger number of electrodes may also be used. For example, the linear electrode array 400 shown in FIG. 4 may include 2-10 electrodes, 10-20 electrodes, 20-50 electrodes, 50-100 electrodes, 100-200 electrodes, or more.

During operation of the capacitive measurement tool 200, the controller 230 uses the electrodes 222 within the linear electrode array 400 to obtain capacitance measurements from the wafer W, while the capacitive sensor unit 220 shown in FIG. 4 is positioned a fixed distance away from the wafer surface and either: (a) the capacitive sensor unit 220 is scanned in a linear direction across the wafer surface, while the wafer W is held stationary by the wafer mount 210, or (b) the capacitive sensor unit 220 is held stationary, while the wafer W is scanned in a linear direction by the wafer mount 210. In the example embodiment shown in FIG. 4, the wafer W is held stationary while the capacitive sensor unit 220 is scanned from one end of the wafer W to the other along the X direction (e.g., from X to X' or vice versa).

Like the previous embodiment shown in FIG. 3, the linear electrode array 400 shown in FIG. 4 can be used to generate a 3D model of the wafer surface and determine the wafer bow (if present). Unlike the previous embodiment, the capacitive sensor unit 220 shown in FIG. 4 is scanned across the surface of the wafer W to provide a 2D mapping of the wafer surface in the XY directions, while the capacitance values measured between the electrodes 222 and the wafer surface enable a distance to be determined in the Z direction at each electrode 222.

Figure 5:
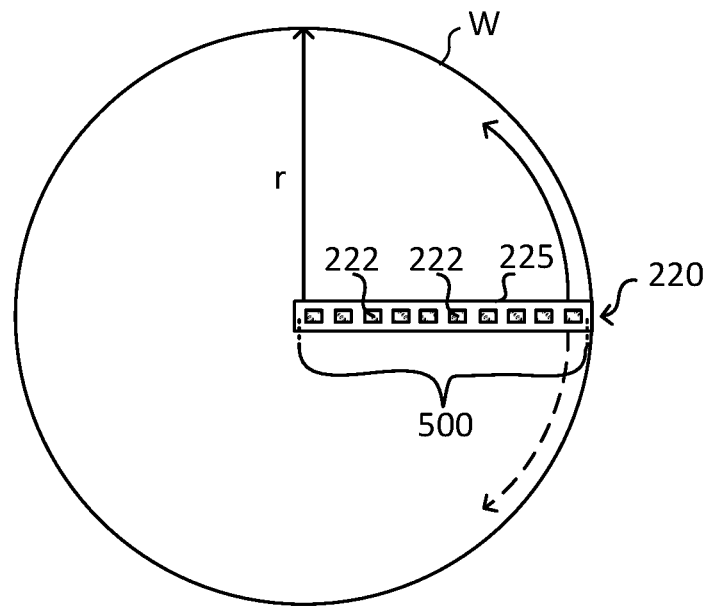
FIG. 5 is a top-down, cross-sectional view through a capacitive sensor unit configured in accordance with a third embodiment of the present disclosure.
Figure 6:
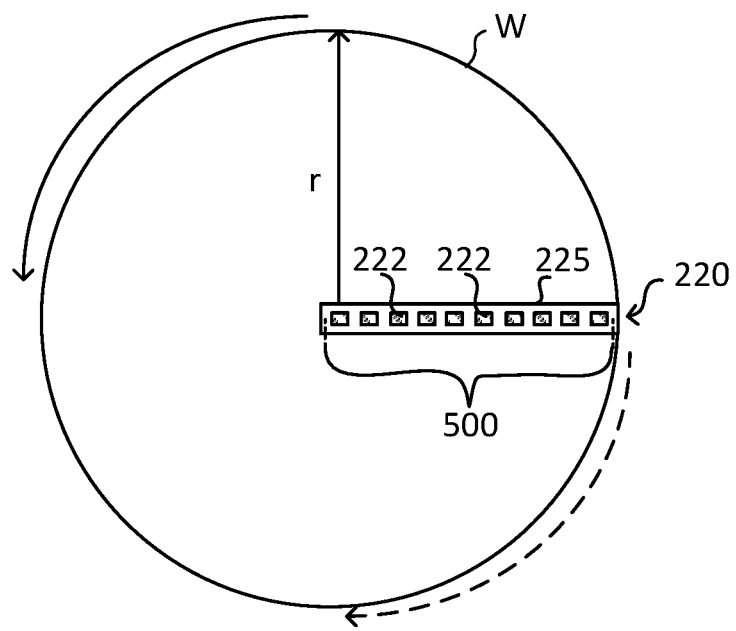
FIG. 6 is a top-down, cross-sectional view through a capacitive sensor unit configured in accordance with a fourth embodiment of the present disclosure.

A third and fourth embodiment of the capacitive sensor unit 220 are shown in FIGS. 5 and 6. In the embodiments shown in FIGS. 5 and 6, the capacitive sensor unit 220 is linear, or bar-shaped, similar to the embodiment shown in FIG. 4. Unlike the previous embodiment, however, the length of the sensor housing 225 shown in FIGS. 5 and 6 is roughly equivalent to the radius (r) of the wafer W, and the electrodes 222 formed on (or embedded within) the first surface 223 of the sensor housing 225 are arranged in a line along the length of the sensor housing 225 to produce a radial electrode array 500.

Like the previous embodiments, the number of electrodes 222 included within the radial electrode array 500 may be determined based on the resolution and throughput of a particular measurement application. In some embodiments, approximately 10 to 50 electrodes may be used to provide a high density electrode array pattern, which can be rotated across the wafer surface to map the wafer surface and determine the global bow of the wafer. However, a smaller or larger number of electrodes may also be used. For example, the radial electrode array 500 shown in FIGS. 5 and 6 may include 2-10 electrodes, 10-20 electrodes, 20-40 electrodes, 40-60 electrodes, or more.

During operation of the capacitive measurement tool 200, the controller 230 uses the electrodes 222 within the radial electrode array 500 to obtain capacitance measurements from the wafer W, while the capacitive sensor unit 220 shown in FIGS. 5 and 6 is positioned a fixed distance away from the wafer surface and either: (a) the capacitive sensor unit 220 is rotated across the wafer surface, while the wafer W is held stationary by the wafer mount 210, or (b) the capacitive sensor unit 220 is held stationary, while the wafer W is rotated by the wafer mount 210. In the example embodiment shown in FIG. 5, the wafer W is held stationary while the capacitive sensor unit 220 is rotated in a counter-clockwise (or clockwise) direction. In the example embodiment shown in FIG. 6, the capacitive sensor unit 220 is held stationary while the wafer W is rotated in a counter-clockwise (or clockwise) direction.

In the embodiments shown in FIGS. 5 and 6, the rotational movement between the radial electrode array 500 and the wafer W provides a 2D mapping of the wafer surface in the XY directions, while the capacitance values measured between the electrodes 222 and the wafer surface enable a distance to be determined in the Z direction at each electrode 222. Thus, like the previous embodiments, the radial electrode array 500 shown in FIGS. 5 and 6 can be used to generate a 3D model of the wafer surface and determine the wafer bow (if present).

The capacitive measurement tool 200 shown in FIGS. 2-6 utilizes a plurality of electrodes 222 to simultaneously obtain a plurality of capacitive measurements from the wafer surface, which are used to calculate variable z-height distances (i.e. distance, D, between each individual electrode and the wafer surface) across the wafer surface. By utilizing the techniques described herein, the capacitive measurement tool 200 shown in FIGS. 2-6 provides accurate 3D mapping of the wafer surface, while greatly reducing measurement time and improving throughput compared to conventional bow measurement techniques.

As noted above and shown in FIGS. 3-6, the capacitive sensor unit 220 may be configured as a stationary disc (FIG. 3), a linear bar (FIG. 4) or a radial bar (FIGS. 5-6). For each of the embodiments shown in FIGS. 3-6 and discussed above, the capacitive sensor unit 220 and the wafer W may be arranged in a horizontal orientation or a vertical orientation when the capacitive measurements are obtained. FIGS. 7-8 illustrate embodiments in which capacitive measurements are obtained from the wafer W, while the capacitive sensor unit 220 and the wafer W are both supported in a horizontal orientation. FIGS. 9-10 illustrate embodiments in which capacitive measurements are obtained from the wafer W, while the capacitive sensor unit 220 and the wafer W are both supported in a horizontal orientation. Although either orientation may be utilized, supporting the wafer W vertically minimizes the force applied in the plane perpendicular to the wafer surface where most of the wafer bow is present. When the wafer W is supported vertically, the force of gravity is in the plane parallel to the wafer surface, and thus, does not significantly affect the wafer bow. While a vertically supported wafer may experience some amount of stretching (or sag), the amount of stretching experienced by a typical 300 mm silicon (Si) wafer is negligible.

FIGS. 7-10 illustrate various embodiments of capacitive measurement tools (otherwise referred to herein as metrology tools) that may utilize the capacitive sensor unit 220 shown in FIGS. 3-6 to obtain capacitive measurements from a horizontally or vertically supported wafer. The capacitive measurement tools shown in FIGS. 7-10 generally include a chamber, which houses a wafer mount and at least one movement device for moving the capacitive sensor unit and/or the wafer W relative to one another. The relative movement between the capacitive sensor unit and the wafer mount can be rotational, horizontal and/or vertical. As shown in FIGS. 7-10 and described in more detail below, the capacitive sensor unit and/or the wafer W can be moved relative to one another by moving the wafer, moving the capacitive sensor unit, or moving both the wafer and the capacitive sensor unit.

Figure 7A:
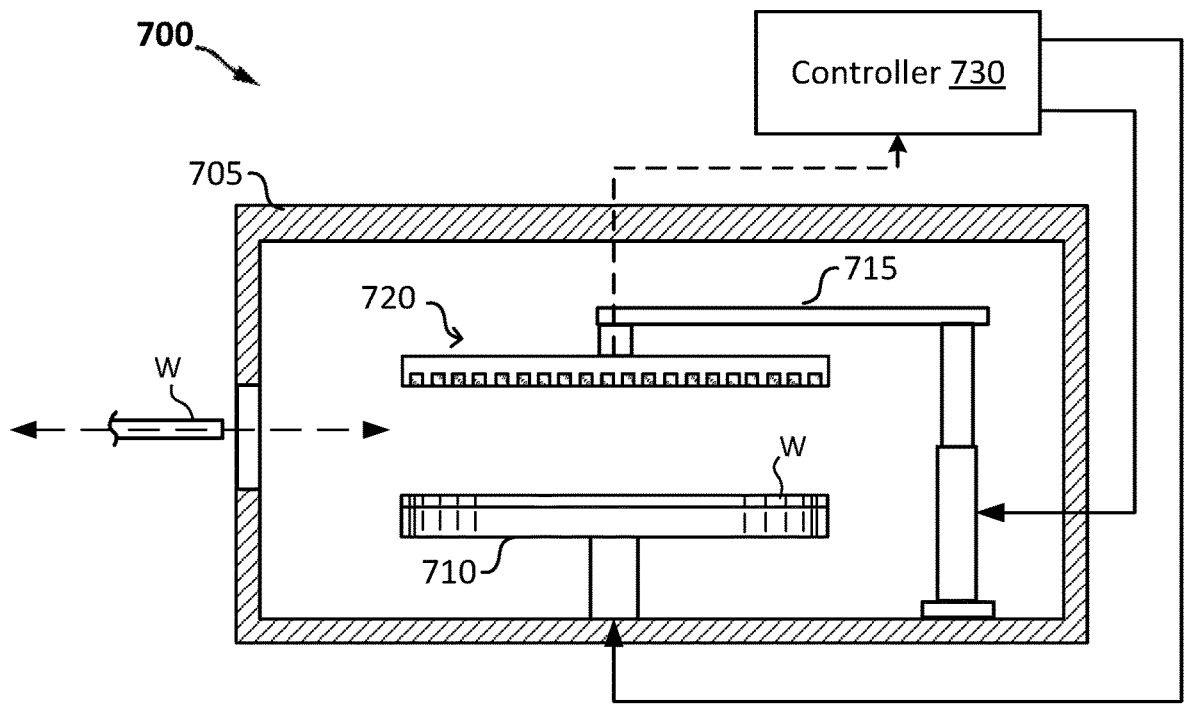
FIGS. 7A-7B illustrate an embodiment of a capacitive measurement tool comprising the capacitive sensor unit shown in FIG. 3 or FIG. 4, wherein the capacitive sensor unit and the wafer are supported in a horizontal orientation.
Figure 7B:
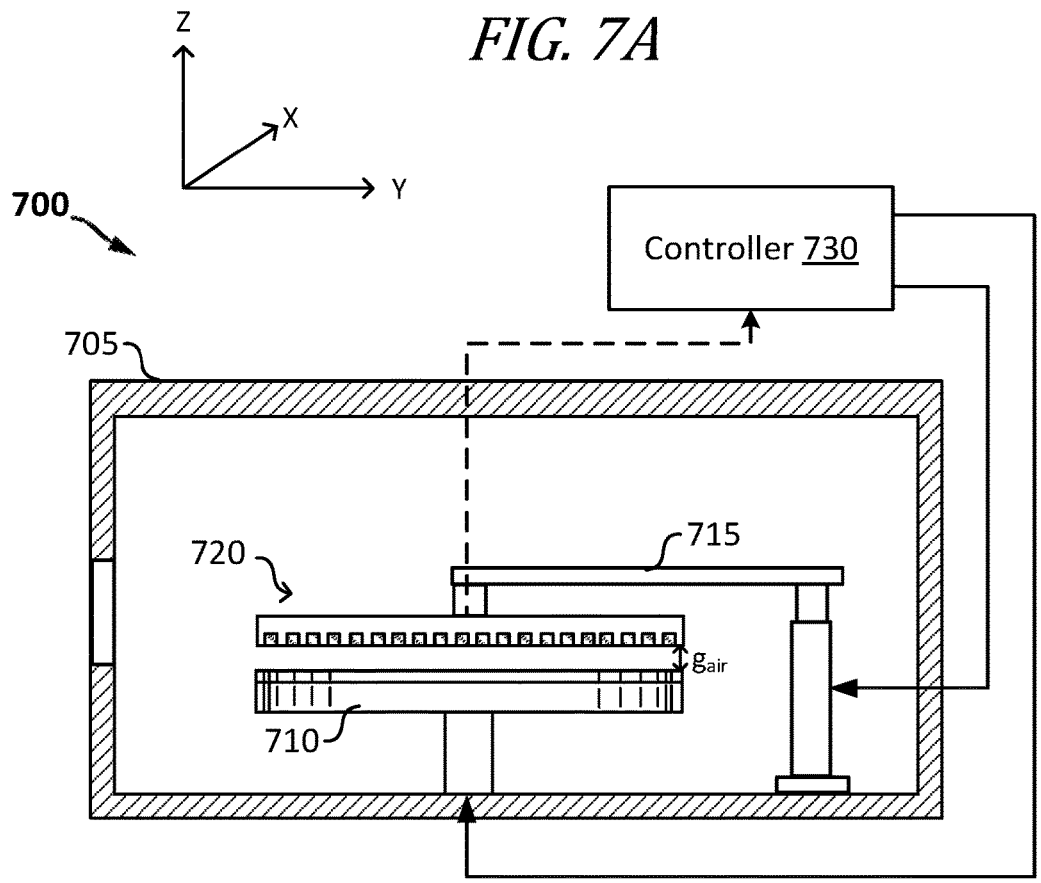

The capacitive measurement tool 700 shown in FIGS. 7A-7B includes a chamber 705 housing a wafer mount 710 and a robotic arm 715 (or movement device), which is coupled at one end to a capacitive sensor unit 720. The robotic arm 715 is configured to move the capacitive sensor unit 720 relative to a wafer W, which is inserted within the chamber 705 and mounted on a support surface of the wafer mount 710. The capacitive sensor unit 720 shown in FIGS. 7A-7B can be a disc-shaped capacitive sensor unit 220 (as shown in FIG. 3) or a bar-shaped capacitive sensor unit 220 (as shown in FIG. 4). In the embodiment shown in FIGS. 7A-7B, the capacitive sensor unit 720 and the wafer W are supported in a horizontal orientation while capacitive measurements are obtained from the wafer surface.

The capacitive measurement tool 700 further includes a controller 730, which is coupled to supply control signals to the robotic arm 715 and/or the wafer mount 710 for moving the capacitive sensor unit 720 and/or the wafer mount 710 relative to one another. After the wafer W is inserted within the chamber 705 and mounted onto the wafer mount 710, as shown in FIG. 7A, the controller 730 may supply control signals to the robotic arm 715 to position the capacitive sensor unit 720 in close proximity to the wafer W, as shown in FIG. 7B. This may involve moving the robotic arm 715 in the X, Y and/or Z directions until the capacitive sensor unit 720 is: (a) centered above (or arranged at one end of) the wafer W, and (b) positioned a fixed distance away from the wafer W, such that a small air gap ($g_{air}$) exists between the lower surface (e.g., the first surface) of the capacitive sensor unit 720 and the upper surface of the wafer W. Alternatively, the controller 730 may supply control signals to the wafer mount 710 (or another movement device coupled to the wafer mount 710) to control movement of the wafer mount 710 in the X, Y and/or Z directions and position the capacitive sensor unit 720 a fixed distance away from the wafer W, as shown in FIG. 7B.

In some embodiments, the controller 730 may perform various functions related to detecting and characterizing wafer bow, in addition to controlling the movement of the capacitive sensor unit 720 and/or the wafer mount 710. For example, the controller 730 may include a voltage source, a capacitance measurement circuit and a processing unit, as described above in reference to FIGS. 2A-2B. Alternatively, the controller 730 may control movement of the capacitive sensor unit 720 and/or the wafer mount 710, while the controller 230 shown in FIGS. 2-2B is used to detect and characterize wafer bow.

In some embodiments, the controller 730 (or the controller 230) may obtain capacitive measurements from the surface of the wafer W, while the capacitive sensor unit 720 and the wafer W are both held stationary. In other embodiments, the controller 730 may supply control signals to the robotic arm 715 to scan the capacitive sensor unit 720 in a linear direction (e.g., the X direction) across the surface of the wafer W, while the controller 730 (or the controller 230) obtains capacitive measurements from the surface of the wafer W held stationary on the wafer mount 710. In yet other embodiments, the controller 730 may supply control signals to the wafer mount 710 (or another movement device coupled to the wafer mount 710) to scan the wafer W in a linear direction (e.g., the X direction), while the controller 730 (or the controller 230) obtains capacitive measurements from the surface of the wafer W and the capacitive sensor unit 720 is held stationary by the robotic arm 715.

Figure 8A:
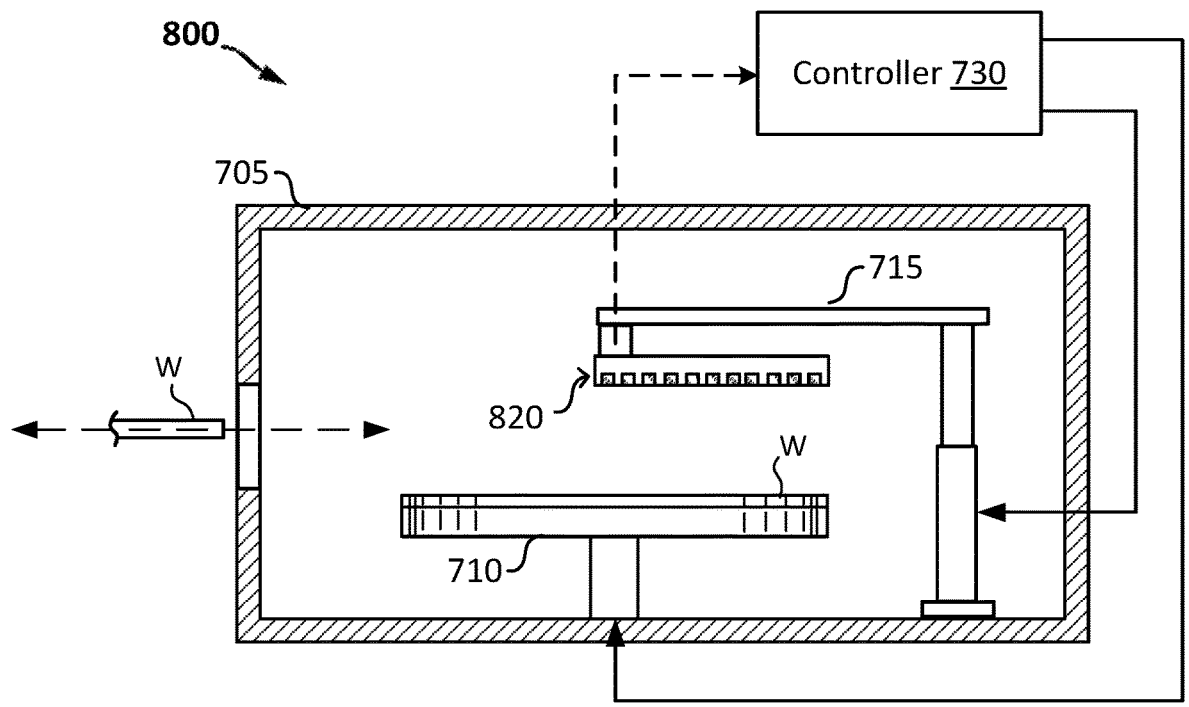
FIGS. 8A-8B illustrate an embodiment of a capacitive measurement tool comprising the capacitive sensor unit shown in FIG. 5 or FIG. 6, wherein the capacitive sensor unit and the wafer are supported in a horizontal orientation.
Figure 8B:
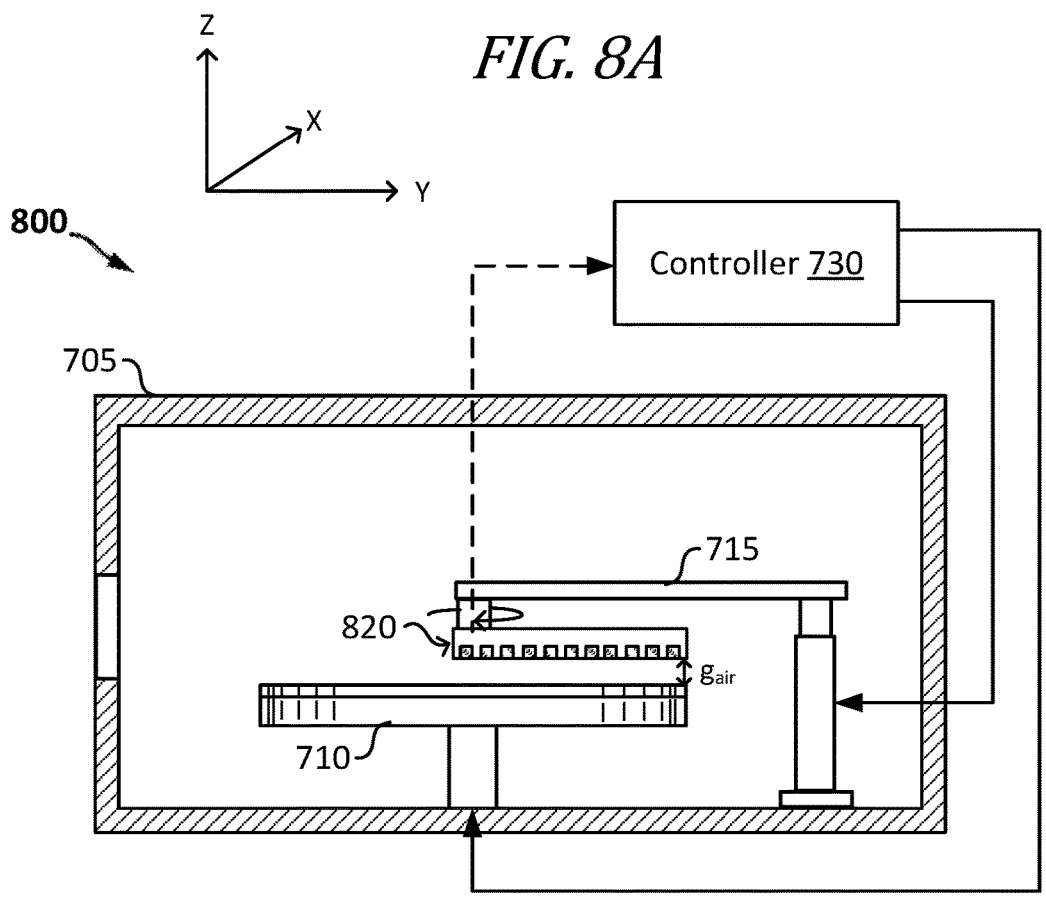

Another embodiment of a capacitive measurement tool 800 is shown in FIGS. 8A-8B. Like the previous embodiment shown in FIGS. 7A-7B, the capacitive measurement tool 800 shown in FIGS. 8A-8B includes a chamber 705, a wafer mount 710 for supporting a wafer W on a horizontal support surface, a robotic arm 715 coupled at one end to a capacitive sensor unit 820 and a controller 730 for controlling movement of the robotic arm 715 and/or the wafer mount 710. Like the previous embodiment shown in FIGS. 7A-7B, the capacitive sensor unit 820 and the wafer W are supported in a horizontal orientation, while capacitance measurements are obtained from the wafer surface.

The capacitive sensor unit 820 shown in FIGS. 8A-8B is a radial bar-shaped capacitive sensor unit 220, as shown in FIGS. 5 and 6. After the wafer W is inserted within the chamber 705 and mounted on a support surface of the wafer mount 710, the controller 730 may supply control signals to the robotic arm 715 (or the wafer mount 710) to position the capacitive sensor unit 820 in close proximity to the wafer W, as shown in FIG. 8B. This may involve moving the robotic arm 715 in the X, Y and/or Z directions until the capacitive sensor unit 820 is: (a) centered above a radius of the wafer W, and (b) positioned a fixed distance away from the wafer W, such that a small air gap ($g_{air}$) exists between the lower surface (e.g., the first surface) of the capacitive sensor unit 820 and the upper surface of the wafer W. Alternatively, the controller 730 may supply control signals to the wafer mount 710 (or another movement device coupled to the wafer mount 710) to control movement of the wafer mount 710 in the X, Y and/or Z directions and position the capacitive sensor unit 820 a fixed distance away from the wafer W, as shown in FIG. 8B.

In some embodiments, the controller 730 may supply control signals to the robotic arm 715 to rotate the capacitive sensor unit 820 in a counter-clockwise (or clockwise) direction across the surface of the wafer W, while the controller 730 (or the controller 230) obtains capacitive measurements from the surface of the wafer W held stationary on the wafer mount 710. In other embodiments, the controller 730 may supply control signals to the wafer mount 710 (or another movement device coupled to the wafer mount 710) to rotate the wafer W in a counter-clockwise (or clockwise) direction, while the controller 730 (or the controller 230) obtains capacitive measurements from the surface of the wafer W while the capacitive sensor unit 820 is held stationary by the robotic arm 715.

Figure 9A:
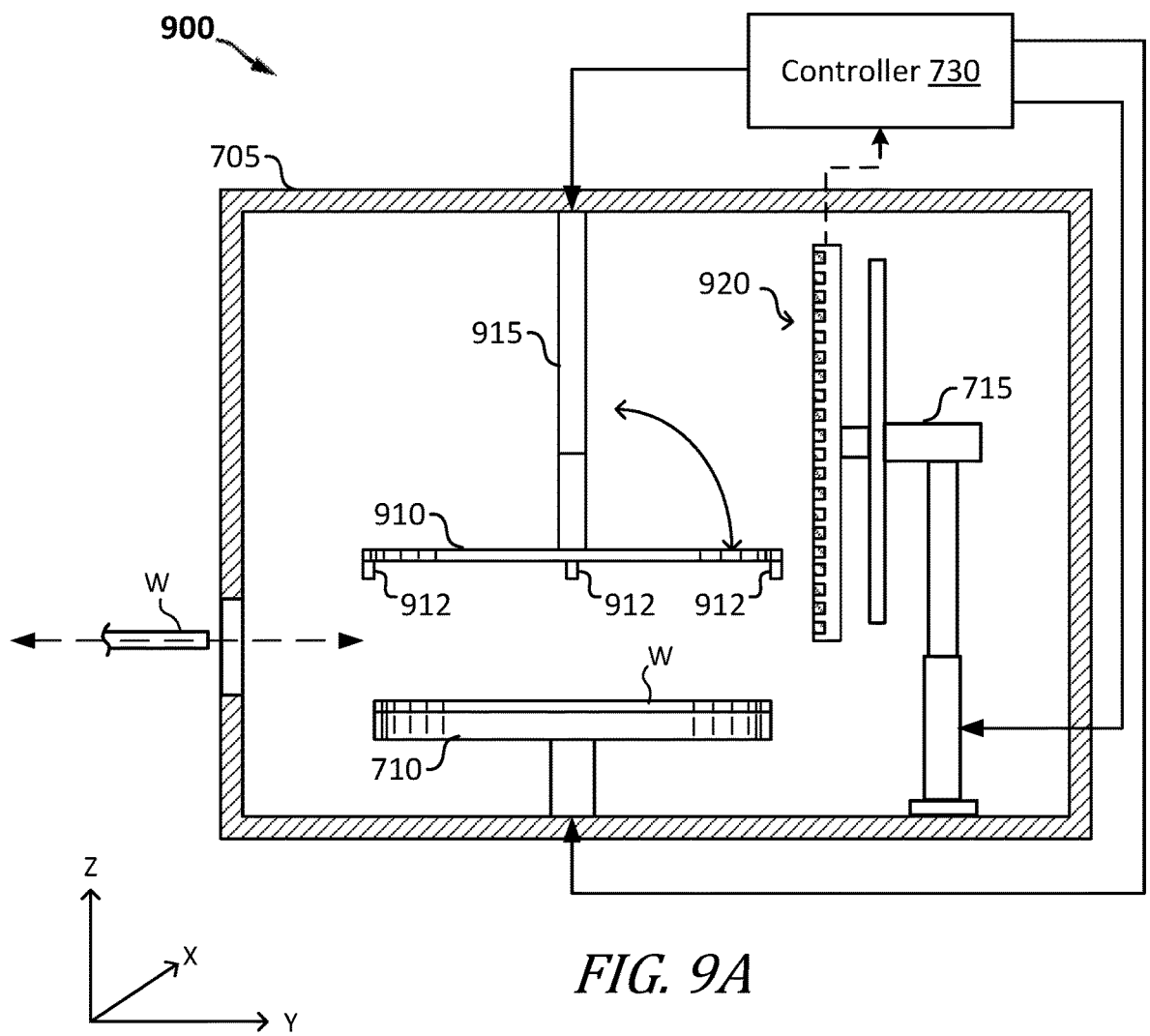
FIGS. 9A-9B illustrate an embodiment of a capacitive measurement tool comprising the capacitive sensor unit shown in FIG. 3 or FIG. 4, wherein the capacitive sensor unit and the wafer are supported in a vertical orientation.
Figure 9B:
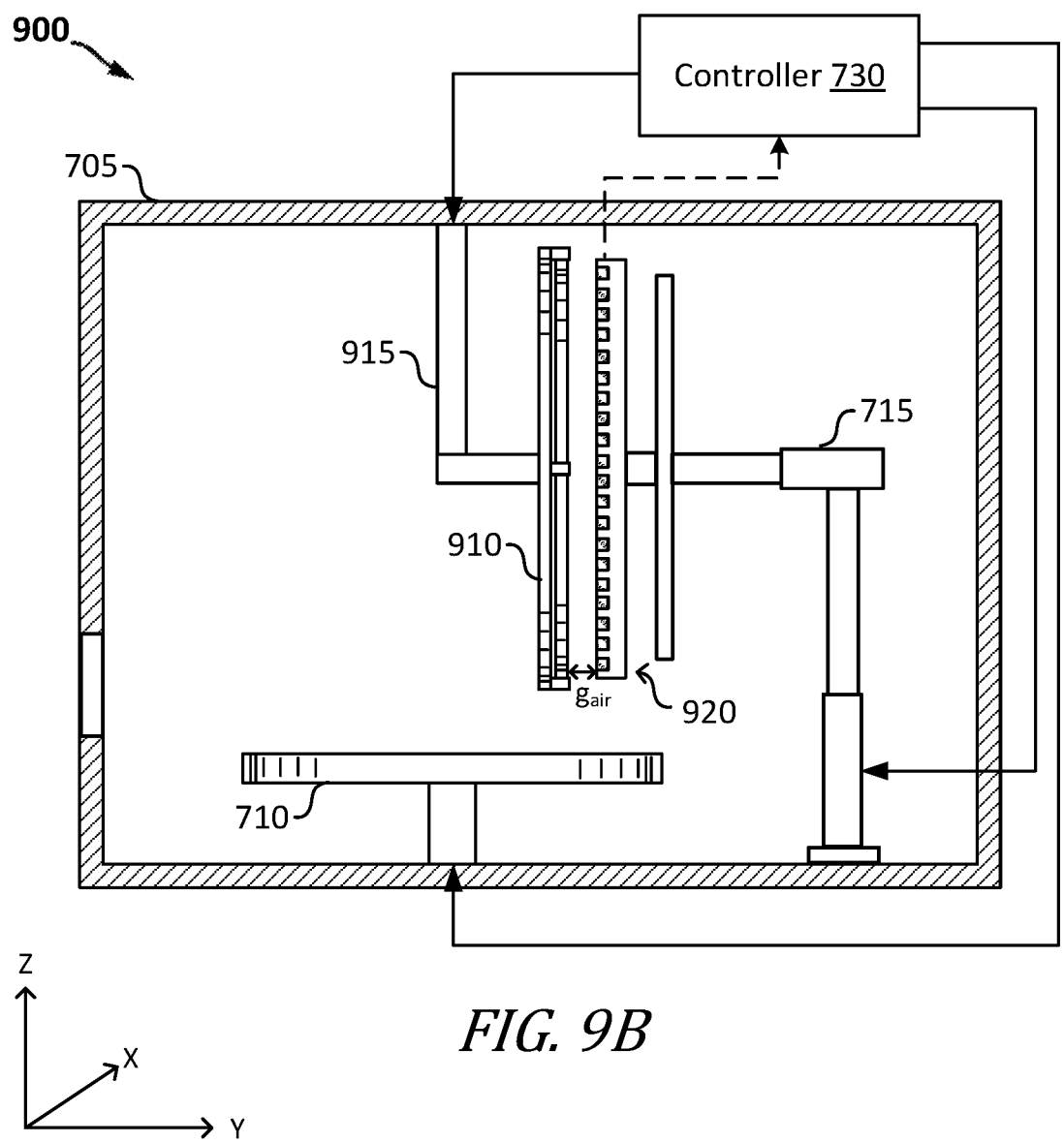
Figure 10A:
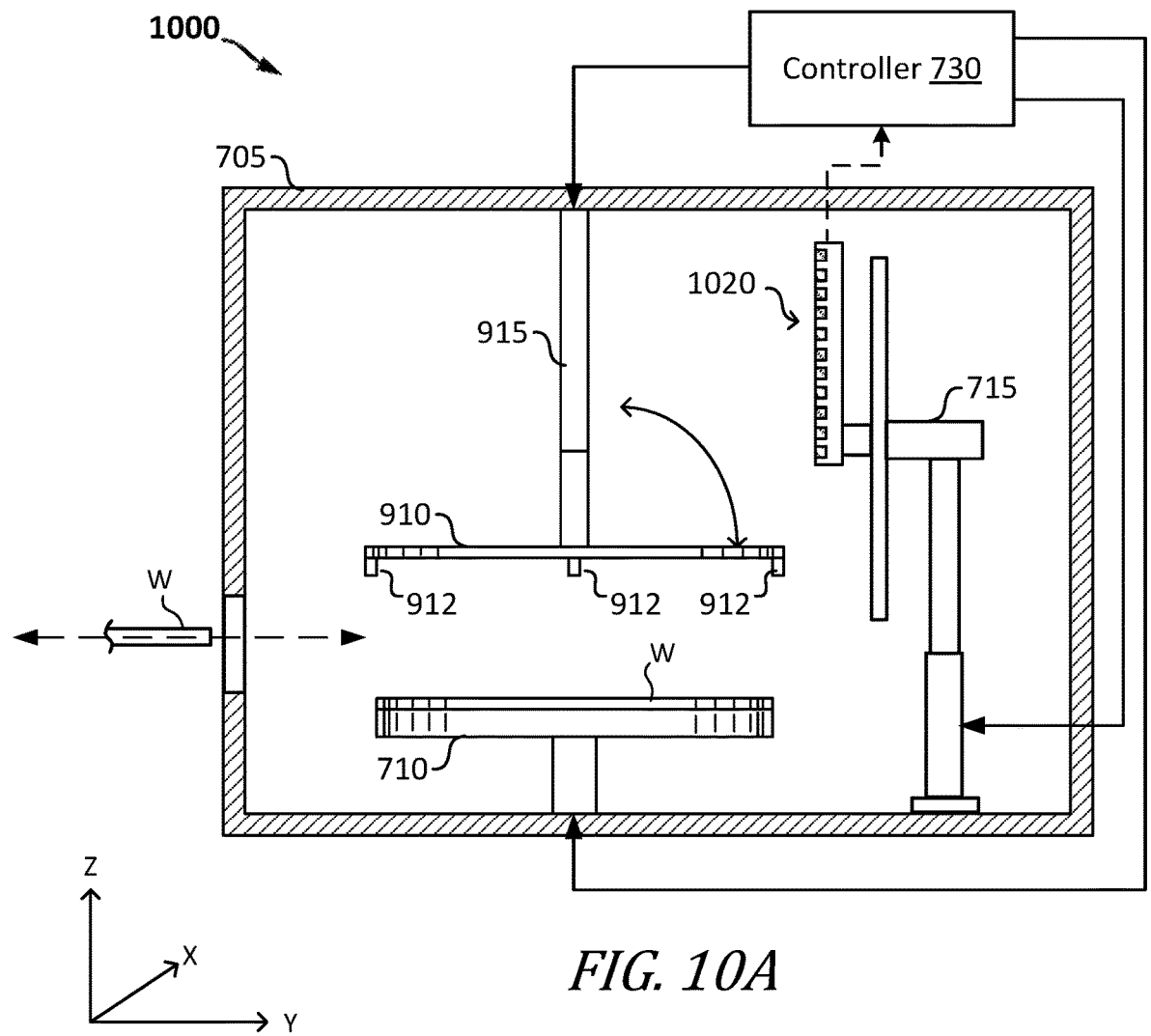
FIGS. 10A-10B illustrate an embodiment of a capacitive measurement tool comprising the capacitive sensor unit shown in FIG. 5 or FIG. 6, wherein the capacitive sensor unit and the wafer are supported in a vertical orientation.
Figure 10B:
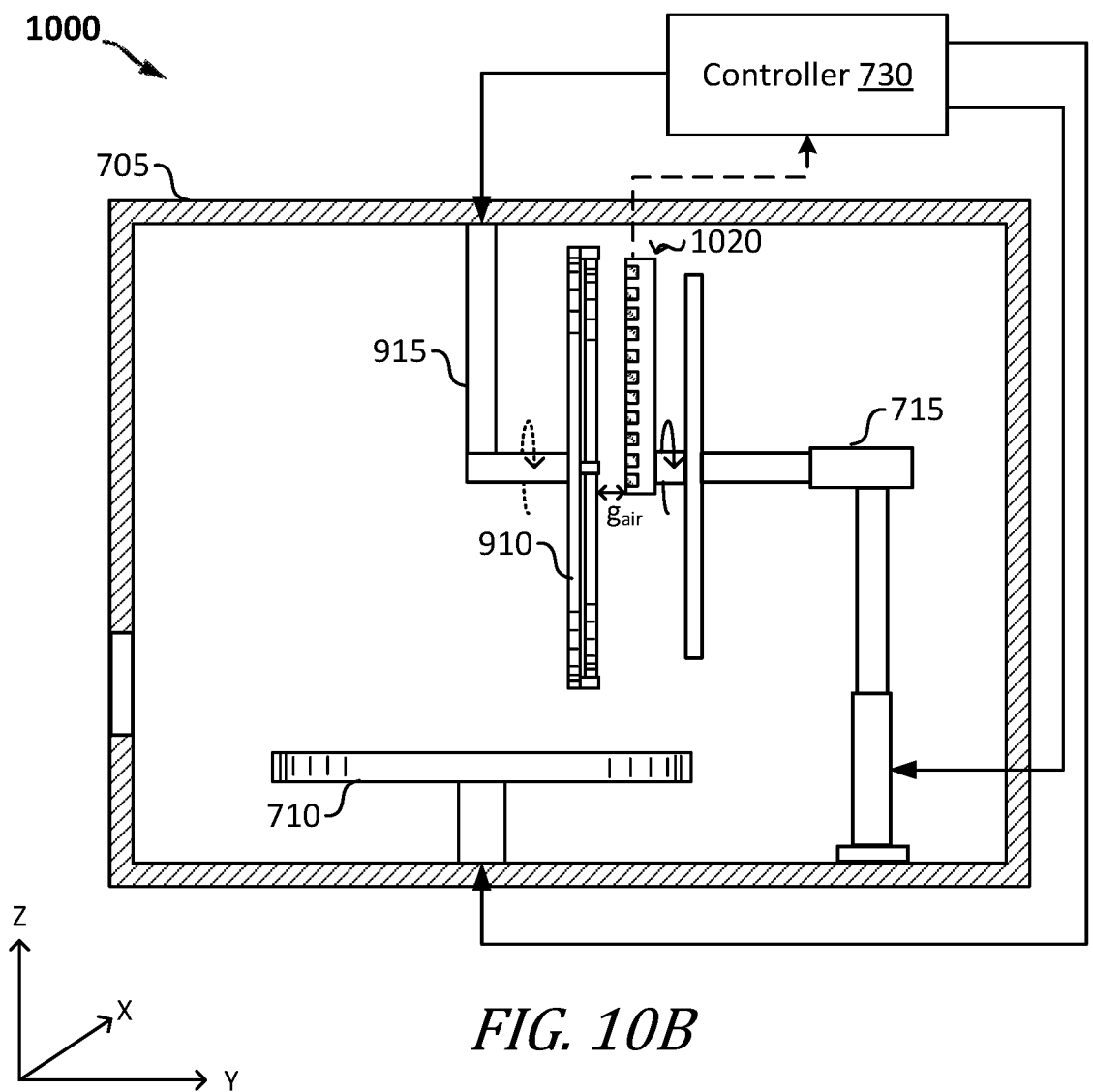

Additional embodiments of capacitive measurement tools are shown in FIGS. 9A-9B and FIGS. 10A-10B. Like the previous embodiments shown in FIGS. 7A-7B and FIGS. 8A-8B, the capacitive measurement tool 900 shown in FIGS. 9A-9B and the capacitive measurement tool 1000 shown in FIGS. 10A-10B each include a chamber 705, an optional horizontal wafer mount 710 for supporting a wafer W on a horizontal support surface, a robotic arm 715 coupled at one end to a capacitive sensor unit 920/1020 and a controller 730 for controlling movement of the robotic arm 715 and/or the wafer mount 710. The capacitive sensor unit 920 shown in FIGS. 9A-9B can be implemented as a disc-shaped capacitive sensor unit 220 (as shown in FIG. 3) or a bar-shaped capacitive sensor unit 220 (as shown in FIG. 4), while the capacitive sensor unit 1020 shown in FIGS. 10A-10B is implemented as a radial bar-shaped capacitive sensor unit 220 (as shown in FIGS. 5 and 6).

Unlike the previous embodiments shown in FIGS. 7A-7B and FIGS. 8A-8B, the capacitive sensor unit 920/1020 and the wafer W are supported in a vertical orientation, while capacitance measurements are obtained from the wafer surface. In order to support a wafer vertically, the embodiments shown in FIGS. 9A-9B and FIGS. 10A-10B further include a vertical wafer mount 910 for supporting the wafer W in a vertical orientation and an additional robotic arm 915 (or movement device) for moving the vertical wafer mount 910.

In the embodiments shown in FIGS. 9A-9B and FIGS. 10A-10B, the vertical wafer mount 910 is a "claw" type wafer mount having a plurality of prongs 912, which are spaced around a circumference of the wafer mount for gripping the outer edges of a wafer. After a wafer W is inserted within the chamber 705 and mounted on the horizontal wafer mount 710, as shown in FIGS. 9A and 10A, the controller 730 supplies control signals to the additional robotic arm 915 that enable the vertical wafer mount 910 to retrieve the wafer W from the horizontal wafer mount 710 and position the wafer W in close proximity to the capacitive sensor unit 920/1020, as shown in FIGS. 9B and 10B. This may involve moving the additional robotic arm 915 in the X, Y and/or Z directions and rotating the additional robotic arm 915 approximately 90° until the wafer W is supported vertically and positioned a fixed distance away from the capacitive sensor unit 920/1020, such that a small air gap ($g_{air}$) exists between the lower surface (e.g., the first surface) of the capacitive sensor unit 920/1020 and the upper surface of the wafer W.

In the embodiment shown in FIG. 9B, the controller 730 (or the controller 230) may obtain capacitive measurements from the surface of the wafer W, while: (a) the capacitive sensor unit 920 and the wafer W are both held stationary, (b) the capacitive sensor unit 920 is scanned in a linear direction (e.g., the X direction) across the surface of the wafer W, while the wafer W held stationary by the vertical wafer mount 910, or (c) the wafer W is scanned in a linear direction (e.g., the X direction), while the capacitive sensor unit 920 is held stationary by the robotic arm 715.

In the embodiment shown in FIG. 10B, the controller 730 (or the controller 230) may obtain capacitive measurements from the surface of the wafer W, while: (a) the capacitive sensor unit 1020 is rotated in a counter-clockwise (or clockwise) direction across the surface of the wafer W, while the wafer W is held stationary by the vertical wafer mount 910, or (b) the wafer W is rotated in a counter-clockwise (or clockwise) direction, while the capacitive sensor unit 1020 is held stationary by the robotic arm 715.

Although a "claw" type wafer mount is shown in FIGS. 9A-9B and FIGS. 10A-10B, other types of vertical wafer mounts may also be used to support the wafer W in a vertical orientation, while capacitance measurements are obtained from the wafer surface. In other embodiments, a "clothes pin" type wafer mount may be used in place of the "claw" type wafer mount shown in FIGS. 9A-9B and FIGS. 10A-10B. The "clothes pin" type wafer mount may have a single clamp for gripping an outer edge of the wafer W. Alternatively, a "cradle" type wafer mount may be used. The "cradle" type wafer mount may include a plurality of clamps (e.g., 2-3 clamps) for gripping outer edges of the wafer W.

One skilled in the art would understand how the capacitive measurement tools shown in FIGS. 9A-9B and FIGS. 10A-10B could be modified to accommodate a "clothes pin" or "cradle" type wafer mount in lieu of the "claw" type wafer mount explicitly is shown in the figures. For example, when a "clothes pin" type wafer mount is utilized to vertically support a wafer, the horizontal wafer mount 710 shown in FIGS. 9A-9B and FIGS. 10A-10B may be omitted and replaced with a wafer cassette (or wafer boat) comprising one or more horizontally stacked wafers. In response to the control signals supplied by the controller 730, the additional robotic arm 915 may use the "clothes pin" type wafer mount to extract a wafer W from the wafer cassette and position the wafer W in close proximity to the capacitive sensor unit 920/1020, as shown in FIGS. 9B and 10B.

Figure 11:
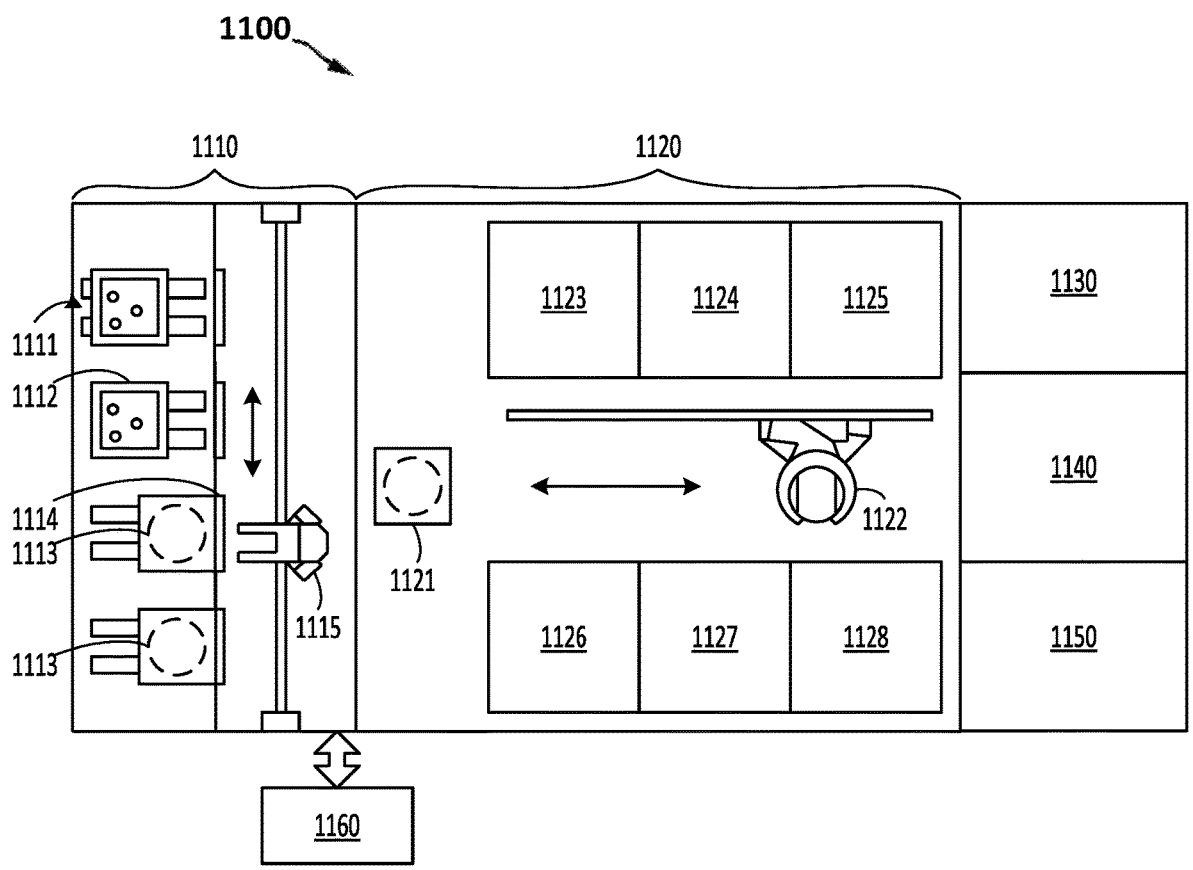
FIG. 11 is a plan view of an exemplary wafer processing system comprising a metrology module for determining wafer bow.

FIG. 11 is a plan view of an exemplary wafer processing system 1100 (e.g., a track lithography tool) for processing a semiconductor wafer. The wafer processing system 1100 includes various wafer handling components or carriers, along with several stages such as, for example, a carrier stage 1110, a treatment stage 1120. The wafer processing system 1100 can also include other wafer processing components, such as for example, a stepper/scanner 1130, a singulation device 1140 and a bonding tool 1150.

The carrier stage 1110 includes one or more pod assemblies 1111 configured to receive one or more wafer cassettes 1112. The wafer cassettes are configured to contain one or more wafers 1113 to be processed by the wafer processing system 1100. The wafers to be processed may be substantially flat as shown in FIG. 1(a), or bowed as shown in FIG. 1(b) or 1(c). Doors 1114 are provided within the pod assemblies 1111 to access the wafers 1113 contained in the wafer cassettes 1112. A carrier transfer robot 1115 can move up and down within the carrier stage 1110 to transfer the wafers 1113 from the wafer cassettes 1112 to a shelf unit 1121, which is provided in the treatment stage 1120 for temporarily storing the wafers 1113.

The treatment stage 1120 includes a plurality of modules 1123-1128 and a treatment transfer robot 1122. The treatment transfer robot 1122 is configured to access the shelf unit 1121 and the modules 1123-1128 for transferring the wafers 1113 among the modules 1123-1128 for various processing. In some embodiments, the treatment transfer robot 1122 can also flip and rotate the wafers 1113 before inserting the wafers into the various modules 1123-1128. The modules 1123-1128 can include a wide variety of treatment modules and metrology modules, as discussed further herein.

For example, the modules 1123-1128 included within the treatment stage 1120 may include at least one metrology module 1123, which is configured to measure an amount of wafer bow of the wafers 1113 and provide bow measurements to the wafer processing system 1100. The wafers 1113, which have a working surface and a backside surface opposite to the working surface, may have an initial wafer bow resulting from one or more microfabrication processing steps that have been executed to create at least part of a semiconductor device on the working surface of the wafer 1113. By characterizing the initial wafer bow and providing an initial wafer bow measurement to the wafer processing system 1100, the wafer processing system 1100 may perform one or more processing steps to correct or mitigate the wafer bow.

The metrology module 1123 detects and characterizes the wafer bow (if present) of a wafer 1113 based on capacitance measurements obtained from the wafer surface. For example, the metrology module 1123 may include any of the capacitance measurement tools shown and described in reference to FIGS. 2-10. Upon receiving a wafer 1113 from the treatment transfer robot 1122, the metrology module 1123 (or capacitance measurement tool) obtains a plurality of capacitive measurements across the wafer surface, calculates z-height deviations across the wafer surface based on the capacitive measurements and stores the z-height deviations by (x, y) coordinates to identify a plurality of sub-bow measurements (x, y), which may be combined to provide a bow measurement.

The bow measurement provided by the metrology module 1123 (or capacitance measurement tool) can include a degree of convexity or concavity, or a mapping of z-height deviation values on a wafer relative to one or more reference z-height deviation values. The reference z-height deviation values may be close to zero, and thus, representative of a wafer that is substantially flat. As used herein, a wafer that is substantially flat (or considered flat for overlay improvement purposes) can be a wafer having an average z-height deviation value of less than, for example, 10 microns. The z-height deviation values calculated by the metrology module 1123 can be spatially mapped (e.g., with (x, y) coordinate locations) to identify z-height deviation values across the wafer surface. The initial bow measurement provided by the metrology module 1123 can include raw bow data, or be represented as a bow signature with relative z-height deviation values. The raw bow data and/or the z-height deviation values can be mapped at various resolutions, depending on types of metrology equipment used and/or a resolution desired.

In some embodiments, the wafer processing system 1100 may use an initial bow measurement provided by the metrology module 1123 (or capacitance measurement tool) to correct or mitigate the wafer bow by performing one or more processing steps on the bowed wafer 1113. For example, the treatment transfer robot 1122 may transfer the bowed wafer 1113 to one or more treatment modules for wafer bow mitigation. Examples of treatment modules that may be used to correct wafer bow include film formation modules, bake modules, etc.

In some embodiments, the modules 1123-1128 included within the treatment stage 1120 can include one or more film formation modules 1124 configured to form one or more films (such as, e.g., a shape control film) on a surface of the wafer 1113 being processed. The film formation module 1124 can be configured to deposit a shape control film on the frontside and/or backside surface of the wafer 1113 using chemical vapor deposition (CVD), atomic layer deposition (ALD), a spin-on film deposition process, or another deposition technique. The film formation module 1124 and the metrology module 1123 can be installed on a common platform having an automated wafer handling system that automatically moves the wafer 1113 from the metrology module 1123 to the film formation module 1124.

In some embodiments, the modules 1123-1128 included within the treatment stage 1120 can also include one or more bake modules 1125 that are configured to bake the wafer 1113 to a target temperature. For example, the bake module 1125 can bake and stabilize the wafer 1113 at 32° C. or 90° C. As another example, the bake module 1125 can bake the wafer 1113 with a shape control material (e.g., a heat sensitive material) formed thereon using a pattern of heat, which corresponds to a bow measurement of the wafer 1113, to correct or modify an internal stress of the shape control layer.

In some embodiments, the modules 1123-1128 included within the treatment stage 1120 can also include one or more radiation sources 1126 that are configured to project radiation of variable intensities, which correspond to the bow measurement of the wafer 1113, onto different regions of the shape control material. The modules 1123-1128 can also include a plurality of heating units 1127, which can be installed on a wafer mount used to support a wafer. The heating units 1127 can have an arrangement corresponding to a certain pattern of heat and generate different temperature ranges of heat, such that the wafer mount has a plurality of heating zones that correspond to the certain pattern of heat. Accordingly, the shape control material can be heated in different regions, which correspond to the certain pattern of heat, and its stresses in the different regions can be modified to become compressive, neutral or tensile.

The wafer processing system 1100 further includes a controller 1160. The controller 1160 can be a computer processor, which is located within the wafer processing system 1100 or located remotely, but in communication with various components of the wafer processing system 1100, such as the metrology module 1123, the film formation module 1124, the bake module 1125, the radiation source 1126 and the heating units 1127. In some embodiments, the controller 1160 may perform the functions of the controller 230 or the controller 730 discussed above.

For example, the controller 1160 may control the metrology module 1123 to measure a wafer bow and identify a bow measurement of the wafer 1113. In some embodiments, the controller 1160 may: (a) control the film formation module 1124 to form a shape control layer on one side of the wafer 1113 (e.g., the backside, frontside or both), (b) control the bake module 1125 to differentially bake the wafer 1113 with the shape control layer formed thereon using a pattern of heat that corresponds to the bow measurement of the wafer 1113, (c) control the radiation source 1126 to project radiation of variable intensities, which correspond to the bow measurement of the wafer 1113, on different regions of the shape control layer, and/or (d) control the heating units 1127 to generate different temperature ranges of heat, which correspond to a certain pattern of heat, to correct or modify the internal stress of the stressor film.

Metrology tools for measuring wafer bow and systems comprising such tools are shown in FIGS. 2-11 and described above. The metrology tools disclosed herein use non-contact capacitive sensing techniques to determine the existence of wafer bow and characterize the wafer bow (if present) based on capacitance measurements obtained from the wafer surface. The metrology tools shown in FIGS. 2-10 improve upon conventional bow measurement tools by providing a capacitive sensor unit, which includes a plurality of electrodes for simultaneously measuring values of capacitance at various locations on the wafer surface. By including a plurality of electrodes within the capacitive sensor unit, the techniques described herein increase the amount of data collected across the wafer surface at any given time to improve the throughput and measurement accuracy of the capacitive measurement tool.

Figure 12:
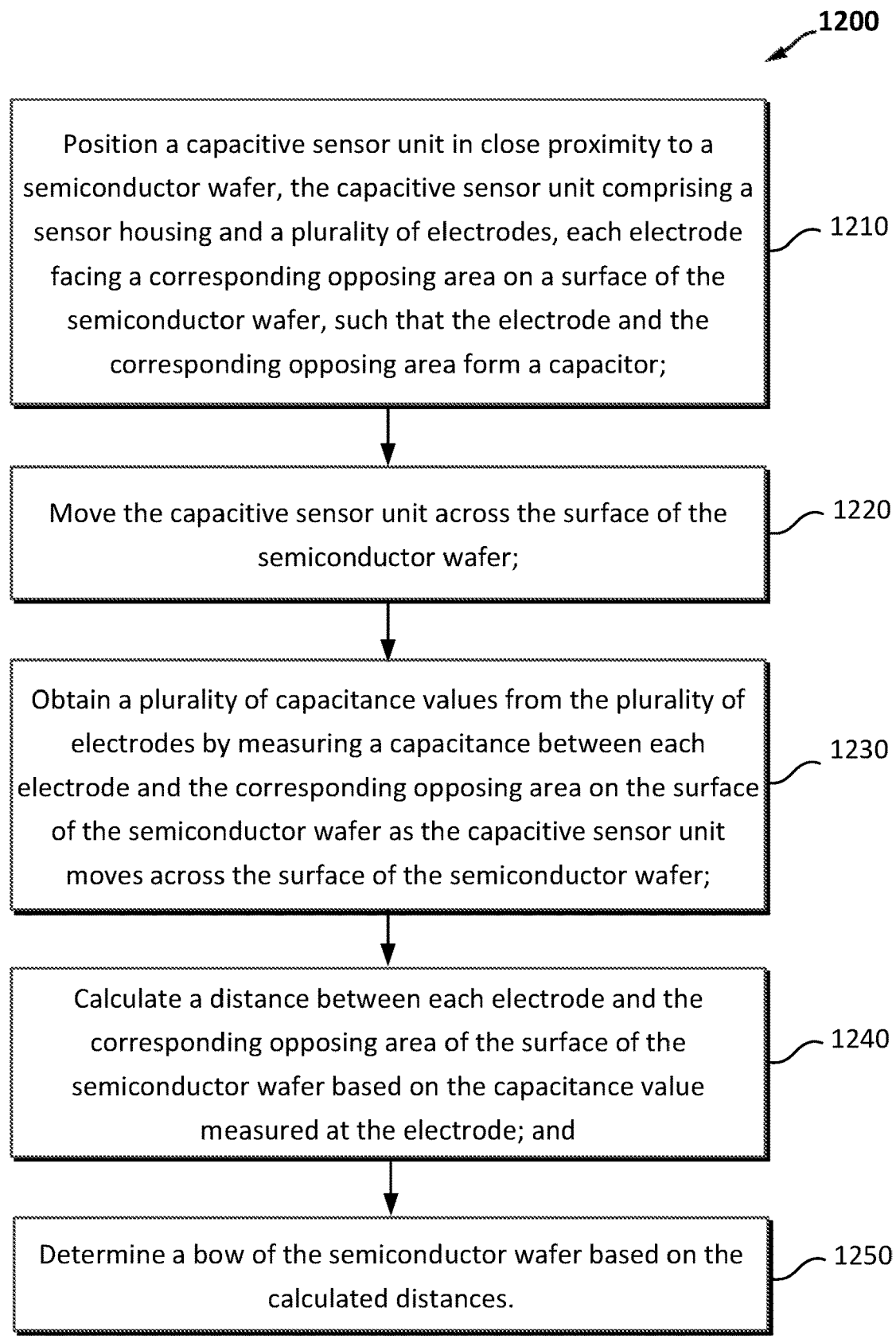
FIG. 12 illustrates one embodiment of a method that utilizes the techniques described herein to measure wafer bow.

FIG. 12 illustrates one embodiment of a method 1200 that utilizes the non-contact capacitive sensing techniques described herein to measure and/or characterize wafer bow. It will be recognized that the embodiment shown in FIG. 12 is merely exemplary and additional methods may utilize the techniques described herein. Further, additional processing steps may be added to the method shown in the FIG. 12 as the steps described are not intended to be exclusive. Moreover, the order of the steps is not limited to the order shown in the figure as different orders may occur and/or various steps may be performed in combination or at the same time.

The method 1200 shown in FIG. 12 begins by positioning a capacitive sensor unit in close proximity to a semiconductor wafer (in step 1210). The capacitive sensor unit may generally include a sensor housing and a plurality of electrodes. When the capacitive sensor unit is positioned in close proximity to the semiconductor wafer (in step 1210), each electrode faces a corresponding opposing area on a surface of the semiconductor wafer, such that the electrode and the corresponding opposing area form a capacitor. Examples of capacitive sensor units that may be used in the method 1200 are shown in FIGS. 2-10.

The method 1200 shown in FIG. 12 further includes moving the capacitive sensor unit across the surface of the semiconductor wafer (in step 1220), obtaining a plurality of capacitance values from the plurality of electrodes by measuring a capacitance between each electrode and the corresponding opposing area on the surface of the semiconductor wafer as the capacitive sensor unit moves across the surface of the semiconductor wafer (in step 1230), calculating a distance between each electrode and the corresponding opposing area of the surface of the semiconductor wafer based on the capacitance value measured at the electrode (in step 1240) and determining a bow of the semiconductor wafer based on the calculated distances (in step 1250).

In some embodiments, the plurality of capacitance values may be obtained (in step 1230) by measuring the capacitance between each electrode and the corresponding opposing area on the surface of the semiconductor wafer while scanning the capacitive sensor unit in a linear direction across the surface of the semiconductor wafer. Examples of capacitive sensor units capable of obtaining capacitance values while scanning across a wafer surface are shown in FIGS. 4, 7A-7B and 9A-9B.

In other embodiments, the plurality of capacitance values may be obtained (in step 1230) by measuring the capacitance between each electrode and the corresponding opposing area on the surface of the semiconductor wafer while rotating the capacitive sensor unit in a radial direction across the surface of the semiconductor wafer. Examples of capacitive sensor units capable of obtaining capacitance values while rotating across a wafer surface are shown in FIGS. 5-6, 8A-8B and 10A-10B.

Improved systems, metrology tools and methods for measuring the bow of a semiconductor wafer, or substrate, are described in various embodiments. The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the systems, metrology tools and methods described herein will be apparent to those skilled in the art in view of this description. It will be recognized, therefore, that the systems, metrology tools and methods described herein are not limited to only the examples provided in the present disclosure. It is to be understood that the forms of the systems, metrology tools and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A system, comprising:
   a wafer mount configured to support a semiconductor wafer;
   a capacitive sensor unit including:
      a sensor housing having a first surface, the first surface facing a surface of the semiconductor wafer when the capacitive sensor unit is in close proximity to the semiconductor wafer; and
      a plurality of electrodes provided on the first surface of the sensor housing and laterally spaced from one another, wherein each electrode works in conjunction with a corresponding opposing area on the surface of the semiconductor wafer to form a capacitor with: (a) the electrode forming a top plate of the capacitor, and (b) the corresponding opposing area on the surface of the semiconductor wafer forming a bottom plate of the capacitor; and
   a controller configured to: (a) obtain a plurality of capacitance values from the plurality of electrodes by measuring a capacitance between each electrode and the corresponding opposing area on the surface of the semiconductor wafer, (b) calculate a distance between each electrode and the corresponding opposing area of the surface of the semiconductor wafer based on the capacitance value measured at the electrode, and (c) determine a bow of the semiconductor wafer based on the calculated distances.

2. The system of claim 1, wherein the capacitive sensor unit is a disc-shaped capacitive sensor unit, and wherein the first surface of the sensor housing has a circular surface area substantially equal to a circular surface area of the semiconductor wafer.

3. The system of claim 2, wherein the plurality of electrodes comprises 10 to 100 electrodes, which are laterally spaced across the first surface of the sensor housing of the disc-shaped capacitive sensor unit in a two-dimensional (2D) electrode array.

4. The system of claim 3, wherein the controller uses the 2D electrode array to simultaneously obtain the plurality of capacitance values from the plurality of electrodes, while the semiconductor wafer is held stationary by the wafer mount and the disc-shaped capacitive sensor unit is held stationary a fixed distance away from the surface of the semiconductor wafer.

5. The system of claim 1, wherein the capacitive sensor unit is a bar-shaped capacitive sensor unit, and wherein a length of the sensor housing is substantially equal to a diameter of the semiconductor wafer.

6. The system of claim 5, wherein the plurality of electrodes comprises 10 to 100 electrodes, which are laterally spaced across the first surface of the sensor housing of the bar-shaped capacitive sensor unit in a linear electrode array.

7. The system of claim 6, wherein the controller uses the linear electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is scanned in a linear direction across the surface of the semiconductor wafer, while the semiconductor wafer is held stationary by the wafer mount, or (b) the bar-shaped capacitive sensor unit is held stationary, while the semiconductor wafer is scanned in a linear direction by the wafer mount.

8. The system of claim 1, wherein the capacitive sensor unit is a bar-shaped capacitive sensor unit, and wherein a length of the sensor housing is substantially equal to a radius of the semiconductor wafer.

9. The system of claim 8, wherein the plurality of electrodes comprises 10 to 50 electrodes, which are laterally spaced across the first surface of the sensor housing of the bar-shaped capacitive sensor unit in a radial electrode array.

10. The system of claim 9, wherein the controller uses the radial electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is rotated across the surface of the semiconductor wafer, while the semiconductor wafer is held stationary by the wafer mount, or (b) the semiconductor wafer is rotated by the wafer mount, while the bar-shaped capacitive sensor unit is held stationary.

11. The system of claim 1, wherein the semiconductor wafer and the capacitive sensor unit are supported in a horizontal orientation, or a vertical orientation, while the plurality of capacitance values are obtained.

12. The system of claim 1, wherein the system is a wafer processing system, and wherein the wafer mount and the capacitive sensor unit are included within a metrology tool, which is provided within the wafer processing system for measuring a wafer bow of at least one semiconductor wafer processed by the wafer processing system.

13. A metrology tool for measuring wafer bow, the metrology tool comprising:
   a wafer mount configured to support a semiconductor wafer;
   a bar-shaped capacitive sensor unit including:
      a sensor housing having a first surface, the first surface facing a surface of the semiconductor wafer when the bar-shaped capacitive sensor unit is in close proximity to the semiconductor wafer; and
      a plurality of electrodes provided on the first surface of the sensor housing and arranged in a line along a length of the sensor housing, wherein each electrode works in conjunction with a corresponding opposing area on the surface of the semiconductor wafer to form a capacitor with: (a) the electrode forming a top plate of the capacitor, and (b) the corresponding opposing area on the surface of the semiconductor wafer forming a bottom plate of the capacitor;

a movement device configured to move at least one of the wafer mount and the bar-shaped capacitive sensor unit relative to each other; and a controller configured to: (a) obtain a plurality of capacitance values from the plurality of electrodes by measuring a capacitance between each electrode and the corresponding opposing area on the surface of the semiconductor wafer, (b) calculate a distance between each electrode and the corresponding opposing area of the surface of the semiconductor wafer based on the capacitance value measured at the electrode, and (c) determine a bow of the semiconductor wafer based on the calculated distances.

14. The metrology tool of claim 13, wherein a length of the sensor housing is substantially equal to a diameter of the semiconductor wafer.

15. The metrology tool of claim 14, wherein the plurality of electrodes comprises 10 to 100 electrodes, which are laterally spaced across the first surface of the sensor housing of the bar-shaped capacitive sensor unit in a linear electrode array.

16. The metrology tool of claim 15, wherein the controller uses the linear electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is scanned in a linear direction across the surface of the semiconductor wafer by the movement device, while the semiconductor wafer is held stationary by the wafer mount, or (b) the bar-shaped capacitive sensor unit is held stationary, while the semiconductor wafer supported by the wafer mount is scanned in a linear direction by the movement device.

17. The metrology tool of claim 13, wherein a length of the sensor housing is substantially equal to a radius of the semiconductor wafer.

18. The metrology tool of claim 17, wherein the plurality of electrodes comprises 10 to 50 electrodes, which are laterally spaced across the first surface of the sensor housing of the bar-shaped capacitive sensor unit in a radial electrode array.

19. The metrology tool of claim 18, wherein the controller uses the radial electrode array to simultaneously obtain the plurality of capacitance values from the plurality of electrodes, while the bar-shaped capacitive sensor unit is positioned a fixed distance away from a surface of the semiconductor wafer and either: (a) the bar-shaped capacitive sensor unit is rotated across the surface of the semiconductor wafer by the movement device, while the semiconductor wafer is held stationary by the wafer mount, or (b) the semiconductor wafer supported by the wafer mount is rotated by the movement device, while the bar-shaped capacitive sensor unit is held stationary.

20. The metrology tool of claim 13, wherein the semiconductor wafer and the bar-shaped capacitive sensor unit are both supported in a horizontal orientation, or a vertical orientation, while the plurality of capacitance values are obtained.

21. A method of measuring wafer bow, the method comprising:

positioning a capacitive sensor unit in close proximity to a semiconductor wafer, the capacitive sensor unit comprising a sensor housing and a plurality of electrodes, each electrode facing a corresponding opposing area on a surface of the semiconductor wafer, such that the electrode and the corresponding opposing area form a capacitor;

moving the capacitive sensor unit across the surface of the semiconductor wafer;

obtaining a plurality of capacitance values from the plurality of electrodes by measuring a capacitance between each electrode and the corresponding opposing area on the surface of the semiconductor wafer as the capacitive sensor unit moves across the surface of the semiconductor wafer;

calculating a distance between each electrode and the corresponding opposing area of the surface of the semiconductor wafer based on the capacitance value measured at the electrode; and determining a bow of the semiconductor wafer based on the calculated distances.

22. The method of claim 21, wherein said obtaining a plurality of capacitance values from the plurality of electrodes comprises:

measuring the capacitance between each electrode and the corresponding opposing area on the surface of the semiconductor wafer while scanning the capacitive sensor unit in a linear direction across the surface of the semiconductor wafer.

23. The method of claim 21, wherein said obtaining a plurality of capacitance values from the plurality of electrodes comprises:

measuring the capacitance between each electrode and the corresponding opposing area on the surface of the semiconductor wafer while rotating the capacitive sensor unit in a radial direction across the surface of the semiconductor wafer.

* * * * *